(12) United States Patent
Boniardi et al.

(10) Patent No.: US 12,080,365 B2
(45) Date of Patent: Sep. 3, 2024

(54) ANALOG STORAGE USING MEMORY DEVICE

(71) Applicant: Micron Technology, Inc., Boise, ID (US)

(72) Inventors: Mattia Boniardi, Cormano (IT); Innocenzo Tortorelli, Cernusco sul Naviglio (IT)

(73) Assignee: Micron Technology, Inc., Boise, ID (US)

( * ) Notice: Subject to any disclaimer, the term of this patent is extended or adjusted under 35 U.S.C. 154(b) by 618 days.

(21) Appl. No.: 17/048,669

(22) PCT Filed: Jan. 28, 2020

(86) PCT No.: PCT/IB2020/000015
§ 371 (c)(1),
(2) Date: Oct. 19, 2020

(87) PCT Pub. No.: WO2021/152338
PCT Pub. Date: Aug. 5, 2021

(65) Prior Publication Data
US 2023/0114966 A1 Apr. 13, 2023

(51) Int. Cl.
*G11C 27/00* (2006.01)
*G06N 3/065* (2023.01)
*G06N 3/08* (2023.01)

(52) U.S. Cl.
CPC ........... *G11C 27/005* (2013.01); *G06N 3/065* (2023.01); *G06N 3/08* (2013.01)

(58) Field of Classification Search
CPC .............. G11C 27/005; G11C 11/5678; G11C 11/5685; G11C 13/0004; G11C 13/0007;
(Continued)

(56) References Cited

U.S. PATENT DOCUMENTS 5,557,567 A * 9/1996 Bergemont ......... G11C 11/5628
365/185.26
5,594,685 A * 1/1997 Bergemont ......... G11C 11/5635
365/185.27
(Continued)

FOREIGN PATENT DOCUMENTS

| CA | 2229611 C * | 4/2006 | ............ G11C 11/56 |
| WO | WO-9618998 A1 * | 6/1996 | ......... G11C 11/5621 |
| WO | WO-2007132453 A2 * | 11/2007 | .......... G06F 11/1016 |

OTHER PUBLICATIONS

Moneck, Matthew Thomas, Development of novel prototype scalable magnetoresistive random access memory, 2008, Carnegie Mellon University. All pages. (Year: 2008).*
(Continued)

*Primary Examiner* — Michael T Tran
(74) *Attorney, Agent, or Firm* — Greenberg Traurig

(57) ABSTRACT

Methods, systems, and devices for analog storing information are described herein. Such methods, systems and devices are suitable for synaptic weight storage in electronic neuro-biological mimicking architectures. A memory device may include a plurality of memory cells each respective memory cell in the plurality of memory cells with a respective programming sensitivity different from the respective programming sensitivity of other memory cells in the plurality. Memory cells may be provided on different decks of a multi-deck memory array. A storage element material of a respective memory cell may have a thickness and/or a composition different from another thickness or composition of a respective storage element material of another respective memory cell on a different deck in the multi-deck memory array. The memory device may further include reading circuitry configured to analogically read respective information programmed in the respective memory cells and to provide an output based on a combination of the respec-
(Continued)

tive information analogically read from the respective memory cells.

16 Claims, 14 Drawing Sheets

(58) Field of Classification Search
 CPC ............... G11C 7/1006; G11C 11/005; G11C 2013/0045; G11C 2213/71; G11C 11/54; G11C 13/003; G11C 13/0069; G11C 13/004; G06N 3/065; G06N 3/08; G06N 3/049
 USPC .............................................. 365/45, 189.05
 See application file for complete search history.

(56) References Cited

U.S. PATENT DOCUMENTS

| | | | | |
|---|---|---|---|---|
| 6,163,862 | A * | 12/2000 | Adams | G11C 29/02 365/201 |
| 6,169,689 | B1 * | 1/2001 | Naji | G11C 11/5607 365/207 |
| 6,259,627 | B1 * | 7/2001 | Wong | G11C 16/26 365/185.21 |
| 8,644,062 | B2 * | 2/2014 | Kim | G11C 13/0004 365/158 |
| 9,058,869 | B2 * | 6/2015 | Patapoutian | G11C 13/0033 |
| 10,089,170 | B1 * | 10/2018 | Goss | G06F 11/073 |
| 10,957,387 | B1 * | 3/2021 | Mantegazza | H10B 63/80 |
| 11,017,878 | B1 * | 5/2021 | Lu | G11C 17/16 |
| 2001/0017791 | A1 * | 8/2001 | Funyu | G11C 11/408 365/189.07 |
| 2008/0230814 | A1 * | 9/2008 | Lee | H01L 21/823462 438/257 |
| 2009/0067722 | A1 * | 3/2009 | Lin | G06T 7/001 382/181 |
| 2009/0213654 | A1 * | 8/2009 | Perlmutter | G11C 11/5628 365/45 |
| 2010/0102290 | A1 * | 4/2010 | Lu | G11C 13/0097 977/890 |
| 2010/0228515 | A1 * | 9/2010 | Srinivasan | H04L 1/24 702/124 |
| 2011/0134286 | A1 * | 6/2011 | Inoue | H04N 23/71 348/E5.079 |
| 2012/0075930 | A1 * | 3/2012 | Patapoutian | G11C 16/0483 365/230.06 |
| 2014/0104924 | A1 * | 4/2014 | Sutardja | G11C 11/1653 365/158 |
| 2014/0112077 | A1 * | 4/2014 | Ish-Shalom | G11C 16/20 365/185.18 |
| 2014/0198597 | A1 * | 7/2014 | Ling | G11C 29/50016 365/222 |
| 2015/0023094 | A1 | 1/2015 | Lam et al. | |
| 2015/0069919 | A1 * | 3/2015 | Radermacher | H05B 47/105 315/297 |
| 2018/0181500 | A1 * | 6/2018 | Shappir | G06F 21/86 |
| 2018/0358094 | A1 | 12/2018 | Allegra et al. | |
| 2019/0043580 | A1 * | 2/2019 | Pirovano | H10B 63/80 |
| 2019/0115072 | A1 | 4/2019 | Nardi et al. | |
| 2019/0206480 | A1 * | 7/2019 | Robbs | H10B 12/50 |
| 2019/0378566 | A1 | 12/2019 | Boniardi et al. | |
| 2019/0378568 | A1 * | 12/2019 | Robustelli | G11C 13/0023 |
| 2020/0004671 | A1 | 1/2020 | Neufeld et al. | |
| 2020/0379654 | A1 * | 12/2020 | Lin | G11C 29/021 |
| 2021/0005664 | A1 * | 1/2021 | Fratin | H10B 63/845 |
| 2021/0090652 | A1 * | 3/2021 | Arendt | G11C 13/0038 |
| 2022/0189558 | A1 * | 6/2022 | Wu | G11C 16/10 |

OTHER PUBLICATIONS

International Search Report and Written Opinion, PCT/IB2020/000015, mailed on Oct. 13, 2020.

* cited by examiner

ANALOG STORAGE USING MEMORY DEVICE

The present application is a national phase application under 35 U.S.C. § 371 of International Patent Application PCT/IB2020/000015, filed on Jan. 28, 2020, the entire disclosure of which application is hereby incorporated herein by reference.

BACKGROUND

The following relates generally to memory devices and more specifically to analog storage using a memory device.

Memory devices are widely used to store information in various electronic devices such as computers, wireless communication devices, cameras, digital displays, and the like. Information is stored by programing different states of a memory device. For example, binary devices have two states, often denoted by a logic "1" or a logic "0." In other systems, more than two states may be stored. To access the stored information, a component of the electronic device may read, or sense, the stored state in the memory device. To store information, a component of the electronic device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory cells may lose their stored state over time unless they are periodically refreshed by an external power source.

Storing information in analog form rather than in digital form may be convenient in several applications. For example, electronic devices mimicking neuro-biological architectures, also known as neural networks, may take advantage of analog storage resulting from learning techniques to emulate synaptic weight storage. Often, the programming and reading sensitivity of memory devices is insufficient.

BRIEF DESCRIPTION OF THE DRAWINGS

FIG. 3a illustrates an example of a three-dimensional memory array that supports analog storage using a memory device in accordance with embodiments of the present disclosure and FIG. 3b illustrates a diagram of an electrical quantity of memory cells in FIG. 3a.

FIG. 4a illustrates an example of three-dimensional of a memory array that supports analog storage using a memory device in accordance with embodiments of the present disclosure and FIG. 4b illustrates a diagram of an electrical quantity of memory cells in FIG. 4a.

FIG. 5a illustrates an example of a three-dimensional memory array that supports analog storage using a memory device in accordance with embodiments of the present disclosure and FIG. 5b illustrates a diagram of an electrical quantity of memory cells in FIG. 5a.

DETAILED DESCRIPTION

Figure 1:
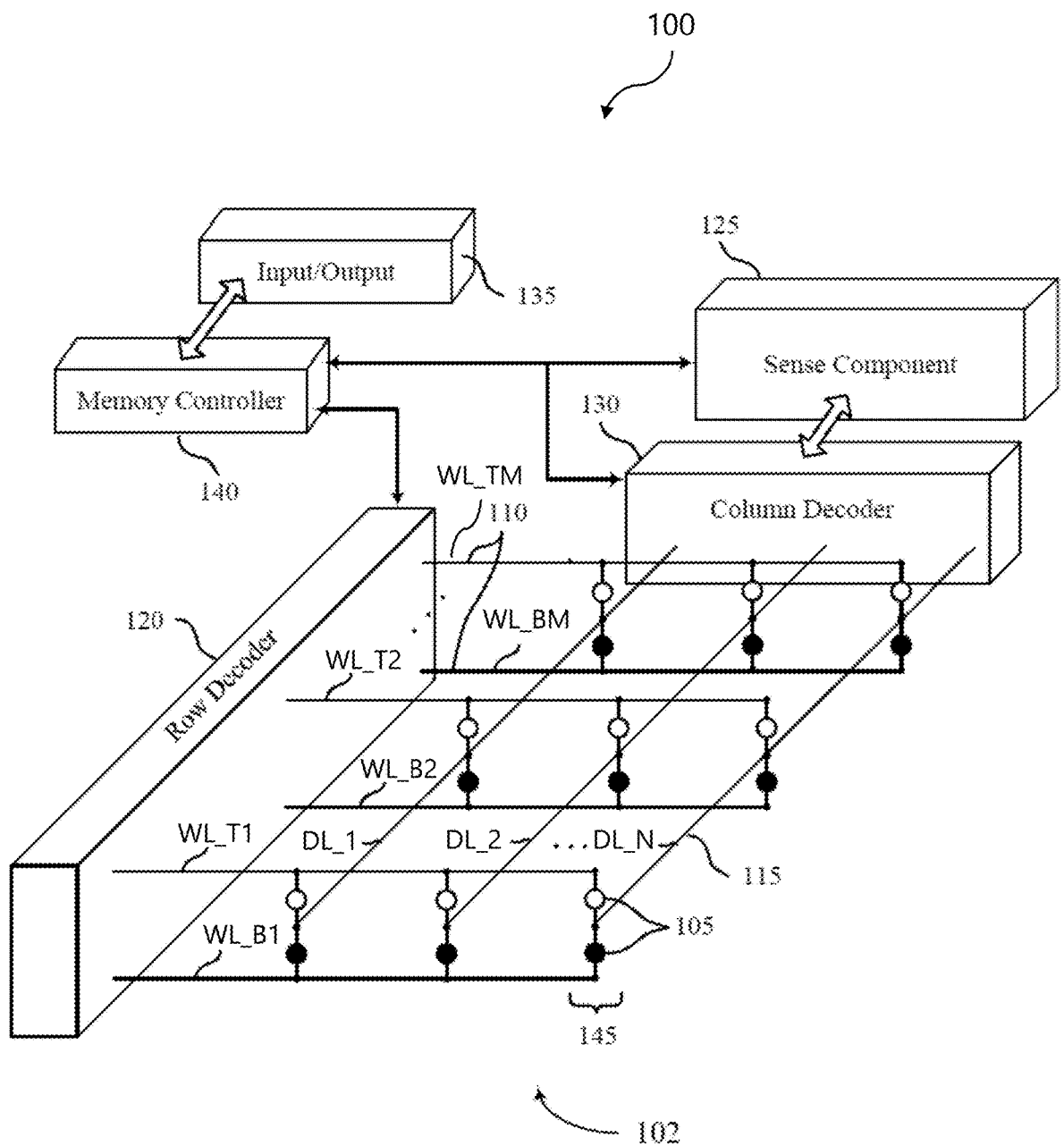
FIG. 1 illustrates an exemplary diagram of a memory device including a three-dimensional array of memory cells that supports analog storage using a memory device in accordance with embodiments of the present disclosure.

Analog information storage may often be more convenient than digital information storage. For example, in neural networks a synaptic weight may refer to the strength or amplitude of a connection between two nodes (e.g., a neuron). The nature and content of information transmitted through a neural network may be based in part on the properties of synapses formed between the nodes (e.g., synaptic weight). Neuromorphic systems and devices, among others, may be designed to achieve results that may not be possible with traditional computer-architectures. For example, neuromorphic systems may be used to achieve results more commonly associated with biological systems such as learning, vision or visual processing, auditory processing, advanced computing, or other processes, or a combination thereof. More generally, analog information storage is a desirable feature also in other non-volatile memory applications not involving neural networks.

Systems, devices, and methods configured to store analog information are described herein. In some embodiments and without limitation, the analog information storage capability is suitable to mimic neuro-biological architectures that may be present in a nervous system and/or to store synaptic weight. Despite normally used to store digital information, memory cells, and in particular non-volatile memory cells, are intrinsically analog in behavior, so they may be operated to store information in analog form, in some embodiments. As it will be evident from the description below, an extended analog storage range, for example with respect to the range that may otherwise be obtained using one memory cell, may be achieved according to embodiments of the present disclosure.

A memory device may include at least one memory unit configured to store a value, such as an analog value. The memory unit may include a first memory cell (e.g., a first memory cell) and one or more other memory cells (e.g., a second memory cell). The memory cells in the memory unit each has a programming sensitivity that differs from a programming sensitivity of other memory cells in the memory unit. Accordingly, when exposed to the same programming pulse or pulses, the different memory cells in the memory unit have a different response and are programmed differently. For example, in a context of a training phase of a neural network system, the same sequence of programming pulses is applied to the cells of the memory unit. Based on the number of programming pulses applied during the training phase, each memory cell of the memory unit, thanks to the different program sensitivity, stores an analog information different from the analog information stored by other memory cells in the memory unit. A reading circuit is configured to access the memory cells in the memory unit and read the analog information programmed in each memory cell. An output may be generated by combining the analog information read from each memory cell of the memory unit. The output may depend on the programming pulses applied during the learning phase and it may be representative of a synaptic weight, in some embodiments.

The respective, e.g., different, programming sensitivity of memory cells may be obtained in a multi-deck memory array, such as a 3D memory array, in some embodiments. Memory cells of the memory unit may be on different decks of the 3D array, for example. The memory cells on different decks may differ from each other in a thickness and/or composition of a storage material, or, in other cases, in a different relative position of some elements of the memory cell, such as a storage element and a selection device.

Figure 10:
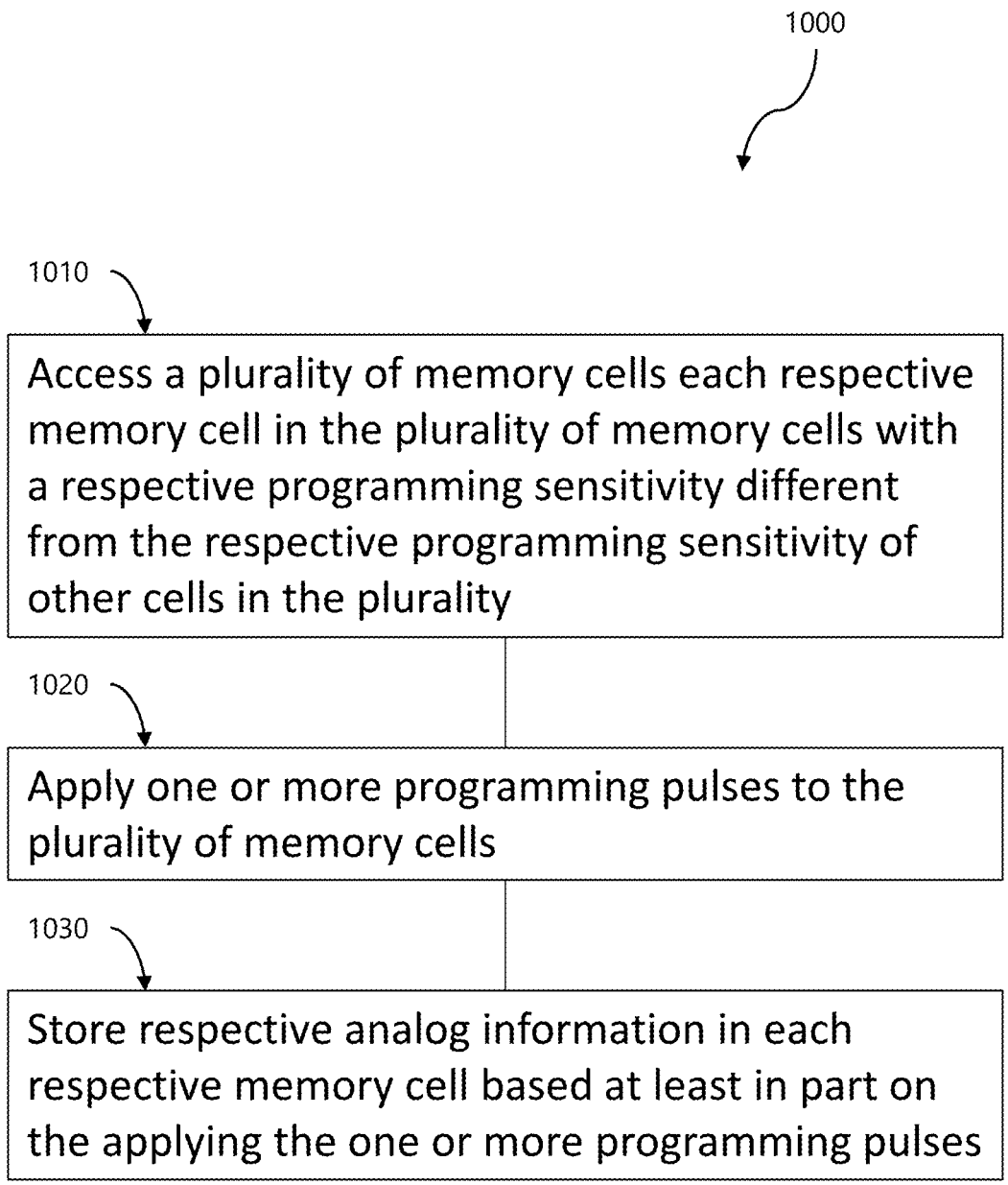
FIGS. 10 through 12 illustrate methods for analog storage using a memory device in accordance with embodiments of the present disclosure.
Figure 11:
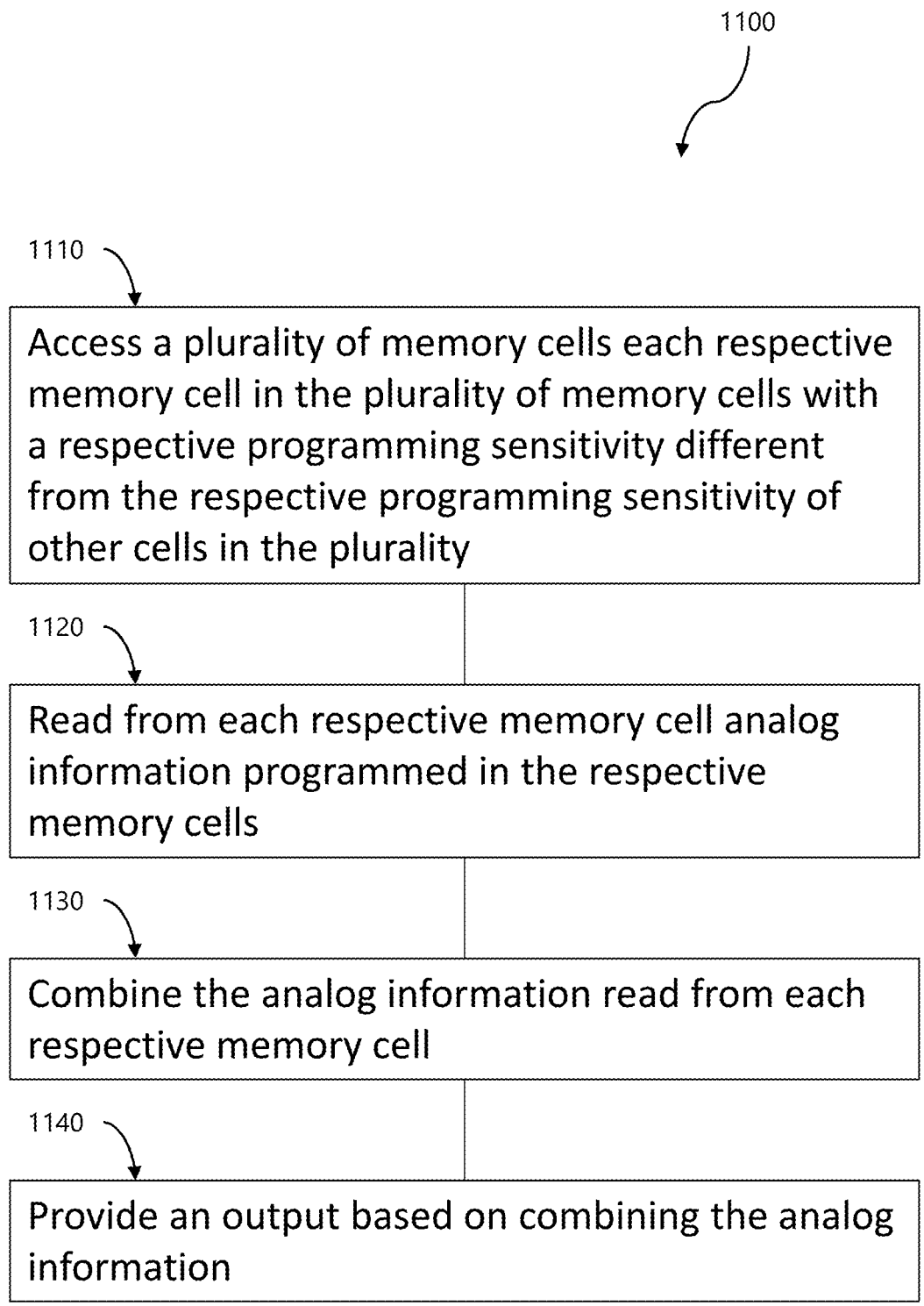
Figure 12:
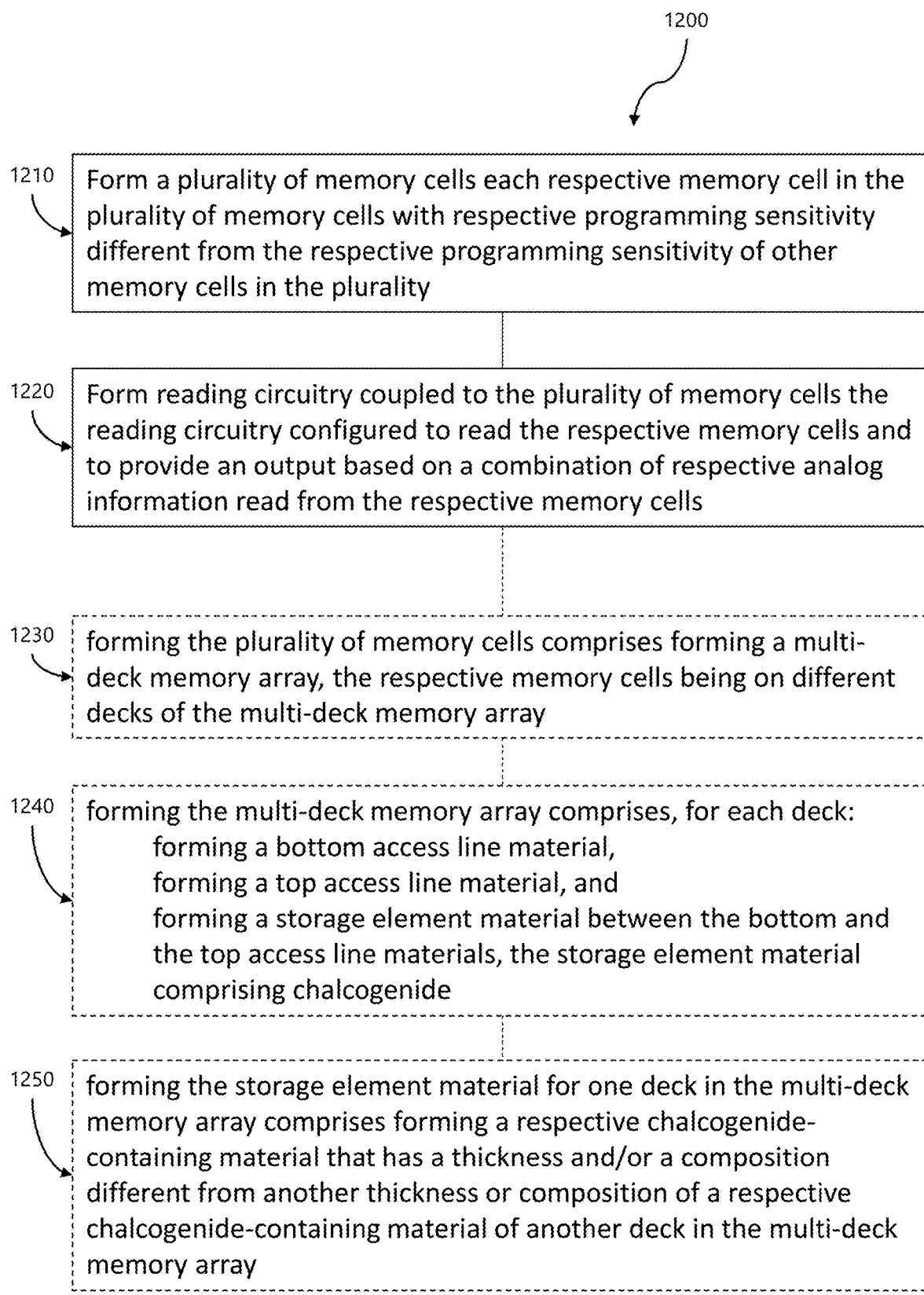

Features of the disclosure introduced above are further described below in the context of a memory device in FIG. 1. Specific examples are then described for an analog storage memory unit of a memory device in FIGS. 2-9. Methods to form, operate and access, e.g., program and/or read, an analog storage memory unit in a memory device are illustrated in FIGS. 10-12. These and other features of the disclosure are further illustrated by and described with reference to apparatus diagrams, system diagrams, and flowcharts that relate to analog storage using a memory device.

FIG. 1 illustrates an exemplary diagram of a memory device including a three-dimensional array of memory cells that supports analog storage using a memory device in accordance with embodiments of the present disclosure. Memory device 100 may also be referred to as an electronic memory apparatus. FIG. 1 is an illustrative representation of various components and features of the memory device 100. As such, it should be appreciated that the components and features of the memory device 100 are shown to illustrate functional interrelationships, not their actual physical positions within the memory device 100. In the illustrative example of FIG. 1, the memory device 100 includes a three-dimensional (3D) memory array 102. The 3D memory array 102 includes memory cells 105 that may be programmable to store different states. In some embodiments, each memory cell 105 may be programmable to store two states, denoted as a logic 0 and a logic 1. In some embodiments, a memory cell 105 may be configured to store more than two logic states. In some examples, a memory cell 105 may be configured to store one of more than two logic states. A memory cell may be configured to store analog information, according to some embodiments. A memory cell 105 may, in some embodiments, include a self-selecting memory cell. It is to be understood that the memory cell 105 may also include a memory cell of another type—e.g., a 3D XPoint™ memory cell, a PCM cell that includes a storage component and a selection component, a CBRAM cell, a FeRAM cell, or a Flash cell. Although some elements included in FIG. 1 are labeled with a numeric indicator, other corresponding elements are not labeled, though they are the same or would be understood to be similar, in an effort to increase the visibility and clarity of the depicted features.

The 3D memory array 102 may include two or more two-dimensional (2D) memory arrays formed on top of one another. This may increase a number of memory cells that may be placed or created on a single die or substrate as compared with 2D arrays, which in turn may reduce production costs, or increase the performance of the memory device, or both. The memory array 102 may include two levels of memory cells 105 and may thus be considered a 3D memory array; however, the number of levels is not limited to two and may in some cases be one or more than two. Each level may be aligned or positioned so that memory cells 105 may be aligned (exactly, overlapping, or approximately) with one another across each level, forming a memory cell stack 145.

In some embodiments, each row of memory cells 105 is connected to a word line 110, and each column of memory cells 105 is connected to a digit line 115 (sometimes referred to as a bit line). Both word lines 110 and digit lines 115 may also be generically referred to as access lines. Further, an access line may function as a word line 110 for one or more memory cells 105 at one deck of the memory device 100 (e.g., for memory cells 105 below the access line) and as a digit line 115 for one or more memory cells 105 at another deck of the memory device (e.g., for memory cells 105 above the access line). Thus, references to word lines and digit lines, or their analogues, are interchangeable without loss of understanding or operation. Word lines 110 and digit lines 115 may be substantially perpendicular to one another and may support an array of memory cells.

In general, one memory cell 105 may be located at the intersection of two access lines such as a word line 110 and a digit line 115. This intersection may be referred to as the address of the memory cell 105. A target memory cell 105 may be a memory cell 105 located at the intersection of an energized (e.g., activated) word line 110 and an energized (e.g., activated) digit line 115; that is, a word line 110 and a digit line 115 may both be energized in order to read or write a memory cell 105 at their intersection. Other memory cells 105 that are in electronic communication with (e.g., connected to) the same word line 110 or digit line 115 may be referred to as untargeted memory cells 105.

As shown in FIG. 1, the two memory cells 105 in a memory cell stack 145 may share a common conductive line such as a digit line 115. That is, a digit line 115 may be coupled with the upper memory cell 105-b and the lower memory cell 105-a. Other configurations may be possible, for example, a third layer (not shown) may share a word line 110 with the upper memory cell 105-b.

In some cases, an electrode may couple a memory cell 105 to a word line 110 or a digit line 115. The term electrode may refer to an electrical conductor, and may include a trace, wire, conductive line, conductive layer, or the like that provides a conductive path between elements or components of memory device 100. Thus, the term electrode may refer in some cases to an access line, such as a word line 110 or a digit line 115, as well as in some cases to an additional conductive element employed as an electrical contact between an access line and a memory cell 105. In some embodiments, a memory cell 105 may comprise a chalcogenide material positioned between a first electrode and a second electrode. The first electrode may couple the chalcogenide material to a word line 110, and the second electrode couple the chalcogenide material to a digit line 115. The first electrode and the second electrode may be the same material (e.g., carbon) or different material. In other embodiments, a memory cell 105 may be coupled directly with one or more access lines, and electrodes other than the access lines may be omitted.

Operations such as reading and writing may be performed on memory cells 105 by activating or selecting word line 110 and digit line 115. Activating or selecting a word line 110 or a digit line 115 may include applying a voltage to the respective line. Word lines 110 and digit lines 115 may be made of conductive materials such as metals (e.g., copper (Cu), aluminum (Al), gold (Au), tungsten (W), titanium (Ti)), metal alloys, carbon, conductively-doped semiconductors, or other conductive materials, alloys, compounds, or the like.

In some architectures, the logic storing device of a cell (e.g., a resistive component in a CBRAM cell, a capacitive component in a FeRAM cell) may be electrically isolated from the digit line by a selection component. The word line 110 may be connected to and may control the selection component. For example, the selection component may be a transistor and the word line 110 may be connected to the gate of the transistor. Alternatively, the selection component may be a variable resistance component, which may comprise chalcogenide material. Activating the word line 110 may result in an electrical connection or closed circuit between the logic storing device of the memory cell 105 and its corresponding digit line 115. The digit line may then be accessed to either read or write the memory cell 105. Upon selecting a memory cell 105, the resulting signal may be used to determine the stored logic state. In some cases, a first logic state may correspond to no current or a negligibly small current through the memory cell 105, whereas a second logic state may correspond to a finite current.

In some cases, a memory cell 105 may include a self-selecting memory cell having two terminals and a separate selection component may be omitted. As such, one terminal of the self-selecting memory cell may be electrically connected to a word line 110 and the other terminal of the self-selecting memory cell may be electrically connected to a digit line 115.

Accessing memory cells 105 may be controlled through a row decoder 120 and a column decoder 130. For example, a row decoder 120 may receive a row address from the memory controller 140 and activate the appropriate word line 110 based on the received row address. Similarly, a column decoder 130 may receive a column address from the memory controller 140 and activate the appropriate digit line 115. For example, memory array 102 may include multiple word lines 110, labeled WL_T1 through WL_TM coupled to memory cells on a top deck and WL_B1 through WL_BM coupled to memory cells on a bottom deck, and multiple digit lines 115, labeled DL_1 through DL_N coupled to memory cells on both top and bottom decks, where M and N depend on the array size. Thus, by activating a word line 110 and a digit line 115, e.g., WL_2 and DL_3, the memory cell 105 at their intersection may be accessed.

A memory cell 105 may be read (e.g., sensed) by a sense component 125 when the memory cell 105 is accessed (e.g., in cooperation with the memory controller 140, row decoder 120, and/or column decoder 130) to determine a logic state stored by the memory cell 105. For example, the sense component 125 may be configured to sense a current or charge through the memory cell 105, or a voltage resulting from coupling the memory cell 105 with the sense component 125 or other intervening component (e.g., a signal development component between the memory cell 105 and the sense component 125), responsive to a read operation. For example, a voltage may be applied to a memory cell 105 (using the corresponding word line 110 and bit line 115) and the presence of a resulting current may depend on the applied voltage and the threshold voltage of the memory cell 105. In some cases, more than one voltage may be applied. Additionally, if an applied voltage does not result in current flow, other voltages may be applied until a current is detected by sense component 125. In some cases, the voltage may be ramped up in magnitude until a current flow is detected. In other cases, determined voltages may be applied sequentially until a current is detected. Likewise, a current may be applied to a memory cell 105 and the magnitude of the voltage to create the current may depend on the electrical resistance or the threshold voltage of the memory cell 105.

The sense component 125 may determine the logic state stored by the memory cell 105 by determining the threshold voltage of the memory cell 105. For example, the sense component 125 may determine a voltage that results in current flow to determine the threshold voltage of the memory cell 105. The sense component 125 may compare the voltage that results in current flow to a reference voltage (e.g., a demarcation read voltage $V_{dm}$). The sense component 125 may determine the logic state stored by the memory cell 105 based on whether the voltage that results in current flow is higher or lower than the reference voltage. In another example, the sense component 125 may apply a determined voltage to the memory cell 105. The sense component 125 may determine the logic state stored by the memory cell 105 based on whether current flows through the memory cell 105 at the determined voltage.

A memory cell 105 may be accessed to retrieve analog information programmed therein, in some embodiments. Sense component 125 may determine an intermediate state, e.g., a state of the cell that is between a set state and a reset state. The set state may correspond to a low threshold/low resistance/high conductivity state of the cell and the reset state may correspond to a high threshold/high resistance/low conductivity state, in some examples. When in an intermediate state, a memory cell 105 may have a threshold/resistance/conductivity that is intermediate between the corresponding values in the set and reset states. This may occur, for example, when partial programming has occurred, as it will be discussed in more detail with reference to FIG. 2b. Sense component 125 may measure a current flowing through the cell 105 when it is biased at a reading a voltage that may be applied to the memory cell 105 using the corresponding word line 110 and bit line 115. IN some cases the reading voltage may be a sub-threshold voltage, e.g., a voltage that is less than an expected threshold voltage associated with either the set or the reset states of the memory cell 105. By applying a sub-threshold voltage, the reading operation is non-destructive, e.g., the memory cell 105 does not change state and it is not disturbed.

The sense component 125 may provide an output signal indicative of (e.g., based at least in part on) the logic state stored by the memory cell 105 to one or more components (e.g., to the column decoder 130, the input/output component 135, the memory controller 140). In some examples, the detected logic state may be provided to a host device (e.g., a device that uses the memory device 100 for data storage, a processor coupled with the memory device 100 in an embedded application), where such signaling may be provided directly from the input/output component 135 or via the memory controller 140.

Sense component 125 may include various transistors or amplifiers to detect and amplify a difference in the signals, which may be referred to as latching. The detected logic state of memory cell 105 may then be output through column decoder 130 as output 135. In some cases, sense component 125 may be part of a column decoder 130 or row decoder 120. Or, sense component 125 may be connected to or in electronic communication with column decoder 130 or row decoder 120. An ordinary person skilled in the art would appreciate that sense component may be associated either with column decoder or row decoder without losing its functional purpose.

Sense component 125 may access more memory cells 105 and provide an output based on a combination of analog information previously programmed to and retrieved from the memory cells 105. In some examples, the sense component may sense, in parallel or sequentially, memory cells 105 on different decks of a 3D memory array 102, the memory cells belonging to an analog storage memory unit (not explicitly identified in FIG. 1). The memory cells 105 of the memory unit need not to be on a same cell stack 145.

In some memory architectures, accessing a memory cell 105 may degrade or destroy a logic state stored by one or more memory cells 105, and rewrite or refresh operations may be performed to return the original logic state to the memory cells 105. In architectures that include a material portion for logic storage, for example, sense operations may cause a change in the atomic configuration or distribution of a memory cell 105, thereby changing the resistance or threshold characteristics of the memory cell 105. Thus, in some examples, the logic state stored in a memory cell 105 may be rewritten after an access operation.

A memory cell 105 may be set or written by similarly activating the relevant word line 110 and digit line 115, and at least one logic value may be stored in the memory cell 105. Column decoder 130 or row decoder 120 may accept data, for example input/output 135, to be written to the memory cells 105. In case of digital storage normally one (or few) programming pulse of appropriate amplitude and duration is applied to the memory cell 105 to modify its state from set to reset state or vice-versa.

For analog programming, conveniently, a sequence of programming pulses may be applied to the memory cells 105 to progressively modify its state. Without being bound by any theoretical interpretation, state modification may imply a phase change, e.g., a modification of microscopic structure from amorphous to crystalline for a reset to set transition, in some cases. The phase change may occur via nucleation and crystal growth processes that may only involve a portion of the storage element material therefore leading to an intermediate state. Memory cells 105 with different programming sensitivity may respond differently to same programming stimuli. For example, memory cells with different thickness and/or composition may start transitioning from one state (e.g., reset/high threshold) to another state (e.g., set/low threshold) after a different number of programming pulses and modify or change their state at a different rate. In a neural-mimicking system, the same programming stimuli may be applied to memory cells 105 with different programming sensitivity to store corresponding but different analog information therein (for example a synaptic weight). Reading back the analog information previously programmed to each cell 105 in an analog memory unit, e.g., by reading its sub-threshold current, may be useful to determine the synaptic weight (or anyway the analog information). Since the multiple memory cells 105 in the analog memory unit have different programming sensitivity, the analog range that may be stored/retrieved is extended with respect to the range available with a sole memory cell.

In some examples, reading a memory cell 105 may be non-destructive. That is, the logic state of the memory cell 105 may not need to be rewritten after the memory cell 105 is read. For example, in architectures that include a material portion for logic storage, sensing the memory cell 105 may not destroy the logic state and, thus, a memory cell 105 may not need rewriting after accessing. For example, sub-threshold current measurement in PCM or self-selecting memories does not modify the state of the memory cell. However, in some examples, refreshing the logic state of the memory cell 105 may or may not be needed in the absence or presence of other access operations. For example, the logic state stored by a memory cell 105 may be refreshed at periodic intervals by applying an appropriate write or refresh pulse or bias to maintain stored logic states. Refreshing a memory cell 105 may reduce or eliminate read disturb errors or logic state corruption.

Figure 2A:
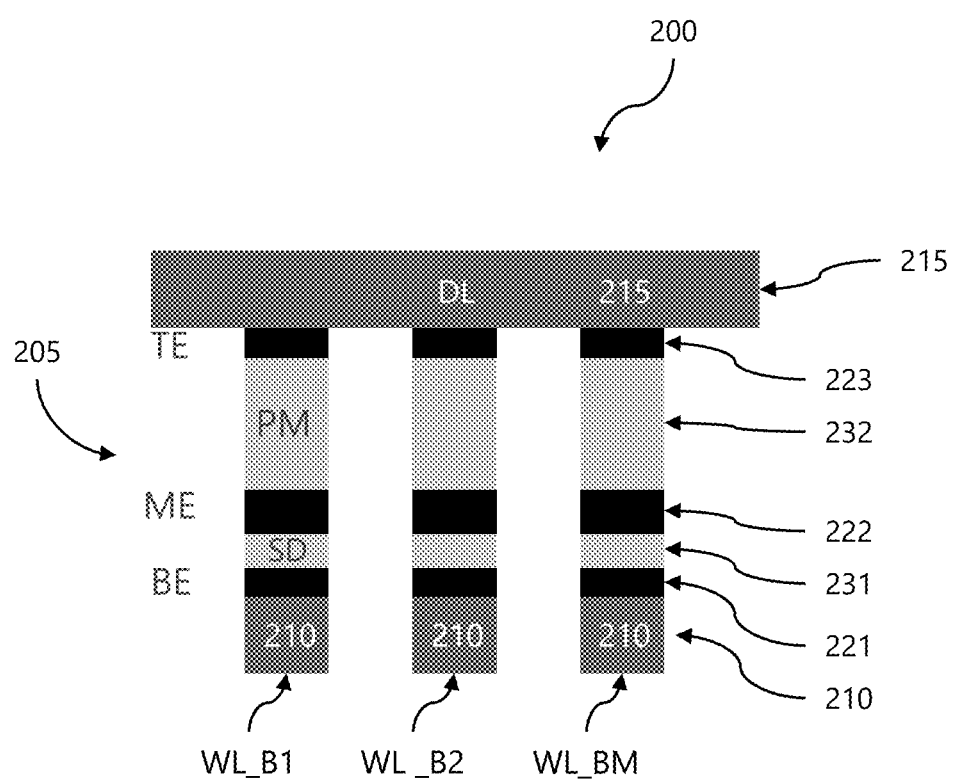
FIG. 2a illustrates an example of a memory array that supports analog storage using a memory device in accordance with embodiments of the present disclosure and FIGS. 2b and 2c illustrate diagrams of electrical quantities of a memory cell in FIG. 2 a for analog storage.
Figure 2B:
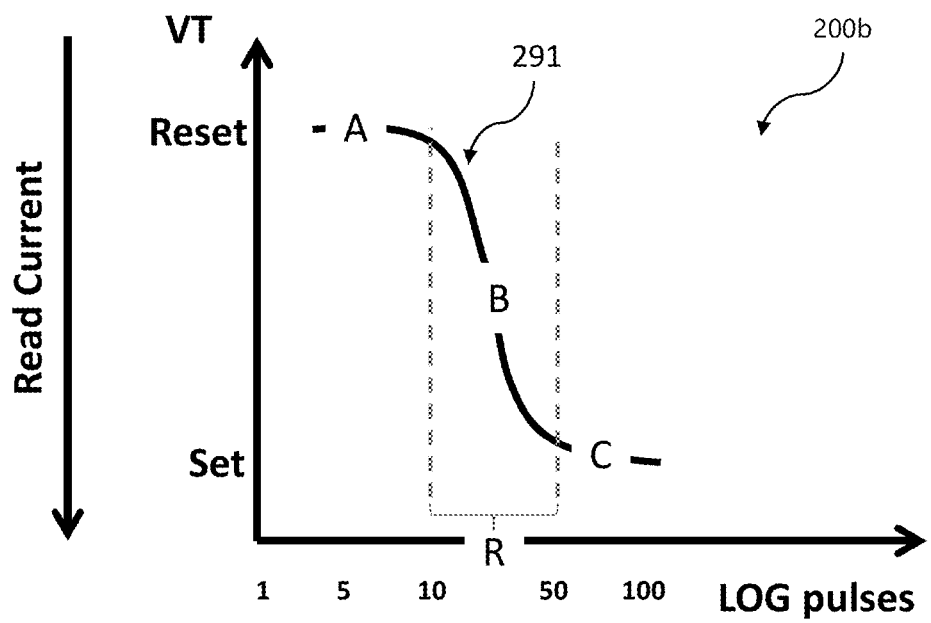
Figure 2C:
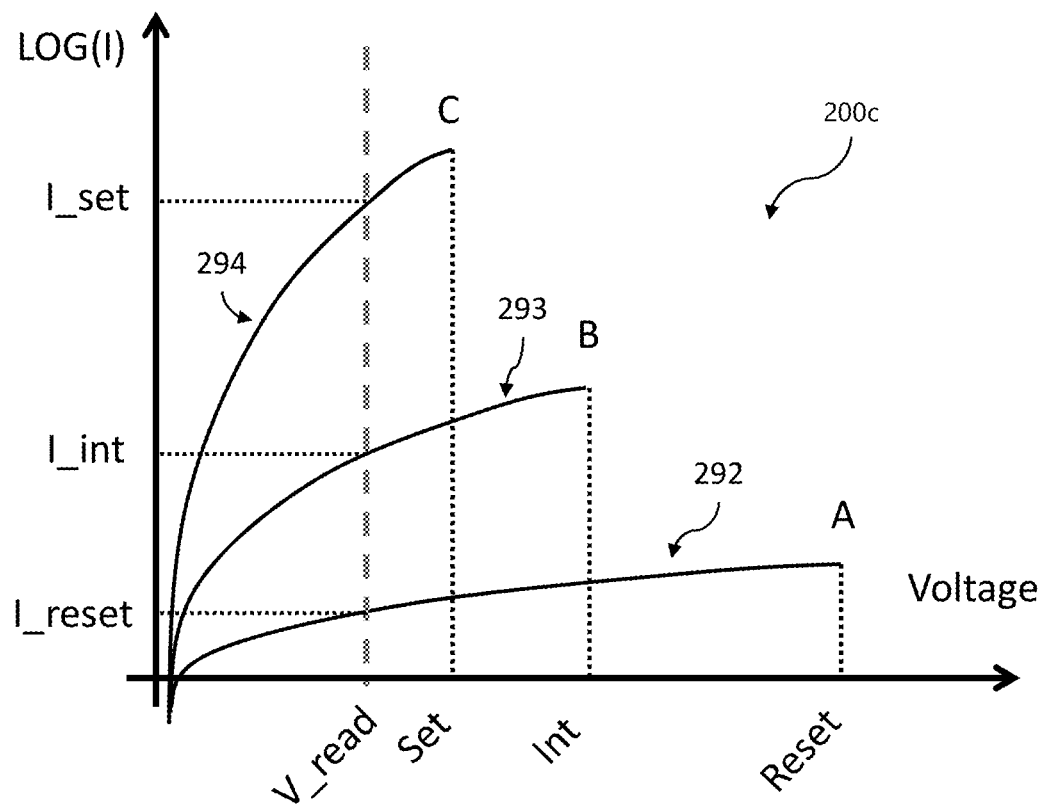

FIG. 2a illustrates an example of a memory array that supports analog storage using a memory device in accordance with embodiments of the present disclosure and FIG. 2b and FIG. 2c illustrate diagrams of electrical quantities of a memory cell in FIG. 2a for analog storage. More specifically, FIG. 2a illustrates a portion of a memory array 200 that supports analog storage. Memory array 200 may be an example of portions of memory array 102 described with reference to FIG. 1. The drawing of FIG. 2a depicts a cross section of memory array 200 along a direction of digit line. For simplicity a single deck of a memory array 200 is depicted, so memory array 200 may be considered a 2D array; however, memory array 200 may have more than one deck (e.g., 3D arrays—not shown in FIG. 2a, but the extension to 3D memory arrays will be clear from subsequent discussion with reference to other Figures).

In the cross section of FIG. 2a, digit line (DL) 215 runs from left to right in the plane of the drawing, while word lines 210, run into the page; digit line 215 and word lines 210 may be an example of digit lines 115 and word lines 110, with reference to FIG. 1. Only three word lines 210 are shown (WL_B1, WL_B2 and WL_BM) but more word lines may be present in some embodiments.

Memory cells 205, that may be examples of memory cells 105 in FIG. 1, are placed at the crossing of word lines 210 and digit line(s) 215 and they may each include a bottom electrode (BE) 221, a selection element (SD) 231, a middle electrode (ME) 222, a storage element (MD) 232 and a top electrode (TE) 223. Bottom electrode 221 is between the selector element 231 and the word line 210; middle electrode 222 is between the selector element 231 and the storage element 232 and top electrode 223 is between storage or memory element 232 and digit line 215.

Memory cells 205 may be cross point PCM memory cells in which the storage element 232 may comprise a chalcogenide material configured to change state between a crystalline state (e.g., a set state) and an amorphous state (e.g., a reset state). The set state is a low-threshold, low resistivity state while the reset state is a high-threshold, high resistivity state, in some embodiments. The storage element 232, also referred to as memory element in some cases, is coupled in series with selection element 231 between a word line 210 and a digit line 215. Selection element 231 may comprise a chalcogenide material that does not undergo phase change and does not contribute to information storage in the memory cells 205. Selection element may contribute to substantially insulate non-addressed memory cells in the array; for example, selection element 231 may zero or substantially reduce any current through memory cells on a same word line or on a same digit line as an addressed memory cell 205. In some embodiments (not shown), a memory cell 205 may only comprise one chalcogenide-containing element that acts both as storage element and selection element; for example, the selection element may be unnecessary in some cases.

Storage and/or selection elements may comprise a chalcogenide material or other alloy including selenium (Se), tellurium (Te), arsenic (As), antimony (Sb), carbon (C), germanium (Ge), silicon (Si), or indium (In), or various combinations thereof In some examples, a chalcogenide material having primarily selenium (Se), arsenic (As), and germanium (Ge) may be referred to as a SAG-alloy. In some examples, a SAG-alloy may also include silicon (Si) and such chalcogenide material may be referred to as SiSAG-alloy. In some other examples, a SAG-alloy may also contain indium (In), and such chalcogenide material may in some cases be referred to as InSAG-alloy. In some examples, a chalcogenide may include additional elements such as hydrogen (H), oxygen (O), nitrogen (N), chlorine (Cl), or fluorine (F), each in atomic or molecular forms.

FIG. 2b illustrates a diagram 200b of curve 291 representing the threshold voltage (on the vertical Y-axis), or a read current (on the second vertical down-oriented Y-axis on the left) of a memory cell in FIG. 2a used for analog storage as function of the number of programming pulses (on the horizontal X-axis, in a logarithmic scale). During a programming operation of a memory cell 205, for example a PCM memory cell as depicted in FIG. 2a, a preconditioning pulse may be applied to the memory cell. A preconditioning programming voltage is applied across the digit line 215 and word line 210 lines. The programming voltage is above a threshold voltage of the memory cell 205 and it may result in melting a chalcogenide material in the storage element 232. By quickly removing the programming voltage the chalcogenide material may be quenched, freezing its microscopic structure in an amorphous or reset state. When in its reset state, a memory cell 205 has a high threshold and high resistivity (e.g., relatively low conductivity), as represented by point A on curve 291 in diagram 200b of FIG. 2b.

If programmed to store a digital information, the memory cell is normally biased with a sole programming pulse with amplitude above its threshold; the programming pulse is not sufficient to induce melting (or complete melting) of the chalcogenide material in the storage element 232. Removing the programming voltage in a relatively slow speed allows nucleation and crystal growth in the storage material that may therefore turn into a crystalline microscopic phase characterized by a low threshold and low resistivity (e.g., relatively high conductivity). This situation is depicted by point C on line 291 of diagram 200b in FIG. 2b.

In order to obtain analog information storage, according to some embodiments, a sequence of programming pulses of lower amplitude and/or smaller duration is applied to the memory cell 205 after it has been preconditioned to the reset state as described above (e.g., it is in point A on curve 291). Each programming pulse will result in a partial programming only (for example, staying with the previous theoretical interpretation, that is not binding, a reduced rate of nucleation and/or growth may be induced by each one of the sequence of the programming pulses). Accordingly, the state of the memory cell 205 translates from point A to point C on curve 291 with the increasing number of pulses. When at intermediate states (e.g., represented by point B on curve 291) the memory cell 205 has an intermediate threshold voltage and/or an intermediate resistivity/conductivity with respect to the corresponding reset (point A) and set (point C) values; the region R between vertical dashed lines represents the range of most programming sensitivity of the memory cell to programming pulses.

Memory cells 205 formed with a particular technology, e.g., with a storage element 232 comprising a chalcogenide material of given composition and of given thickness, have a programming sensitivity that is strictly related to the technology. For example, curve 291 in FIG. 2b depicts a VT-pulse characteristic in which at least about 10 programming pulses are necessary to significantly modify the beginning (reset) state A and in which the complete transition to the end (set) state C occurs after another some 40 pulses—that is programming is essentially saturated after a total of about 50 programming pulses. The number of pulses described above, e.g., about 10 to 50 for modifying the threshold voltage from reset A to set C states, is just an example; the actual number of pulses to start/complete the reset-set transition depends on many factors, both in relation to the memory cell structure (for example, the composition of the storage element 232, the actual dimensions of the various elements and other cell parameters) and to the pulse itself (for example, the pulse amplitude). The transition range R position and width may be adjusted acting on one or more of such structural and/or electrical parameters, in some embodiments.

In some embodiments the programming pulses may be part of a learning phase, such as a Hebbian learning algorithm, for example. In the example depicted in FIG. 2b, the memory cell has a sensitivity limited to a range R of between about 10 and about 50 pulses; outside of this range R, the memory cell is essentially insensitive to the programming stimuli (in the sense that either the number of events is too low, and the memory cell 205 remains in the reset state A, or it is too high, and the memory cells 205 saturates to set state C). Rather than adapting the technology to different learning ranges (e.g., different programming sensitivities) on a case by case basis, as it would in principle be possible, it is described here how to extend the sensitivity range of a device for analog storage.

Turning now to FIG. 2c, curves 292, 293 and 294 represent current-voltage (I-V) characteristics of a memory cell 205 when it is in the reset state A (curve 292), in the set state C (curve 294) and in an intermediate state B (curve 293), respectively. The voltage applied to memory cell 205 (e.g., across the digit line 215 and the word line 210) is represented on the horizontal X-axis and the measured current flowing through the cell in respective state is represented, in logarithmic scale, on the vertical Y-axis. These I-V characteristics are limited to an applied voltage smaller or equal to the threshold voltage of the cell when it is in the respective state. Accordingly, when the applied voltage reaches A (Reset), C (Set) or B (Int), the memory cell 205 thresholds and the subsequent branch of the I-V characteristic is not shown.

To read the state of a memory cell 205, a reading voltage V_read is applied across the digit line 215 and the word line 210 of the memory cell 205. The reading voltage V_read is a subthreshold voltage, so the cell does not threshold whichever its state is. In other words, the reading operation is a non-destructive operation and it is not necessary to reprogram the memory cell after its state has been determined. The current flowing through the addressed memory cell 205 is measured, for example in sense component 125 of FIG. 1. Several current reading schemes are possible and any of them may be used. In some examples, the current flowing in the memory cell may be compared with one or more reference currents, for example. Additionally, the cell current may be converted into a digital signal representative (with the desired level of granularity) of the analog information programmed to and retrieved from the memory cell in form of a current I_Int that may change from a minimum value I_reset (corresponding to reset state A) to a maximum value I_set (corresponding to a set state C).

Memory cells 205 of memory array 200 may be formed by depositing a conductive word line material, a bottom electrode material, a selector element material, a middle-electrode material, a chalcogenide-based storage material, such as a chalcogenide-based material and a top-electrode material. Patterning, for example using photolithographic techniques, lines in a first direction. Fabrication may continue by filling trenches between lines, planarizing and depositing a conductive bit line material. Patterning lines in a second direction, perpendicular to the first direction so as to form pillars each comprising a memory cell 205 may complete processing. The detailed processing details have been omitted not to obscure the example fabrication technology. If multiple decks are to be formed, the processing steps described above may be repeated for form a 3D structure.

Cell operation is based on processing parameters, in some embodiments. For example, set C and reset A threshold voltages may depend on the thickness and composition of the storage element material 232; read currents in set, reset and intermediate states (I_set, I_reset and I_int, respectively) and the program sensitivity range R may also be based on processing parameters. A reading circuit coupled to the memory cells 205 and configured to provide an output based on an analog information read from the memory cells may be formed by standard technology, for example by CMOS technology.

Similar aspects as those described above with reference to FIGS. 2a, 2b and 2c, also apply to other embodiments as they will be described with reference to FIGS. 3-5.

Figure 3A:
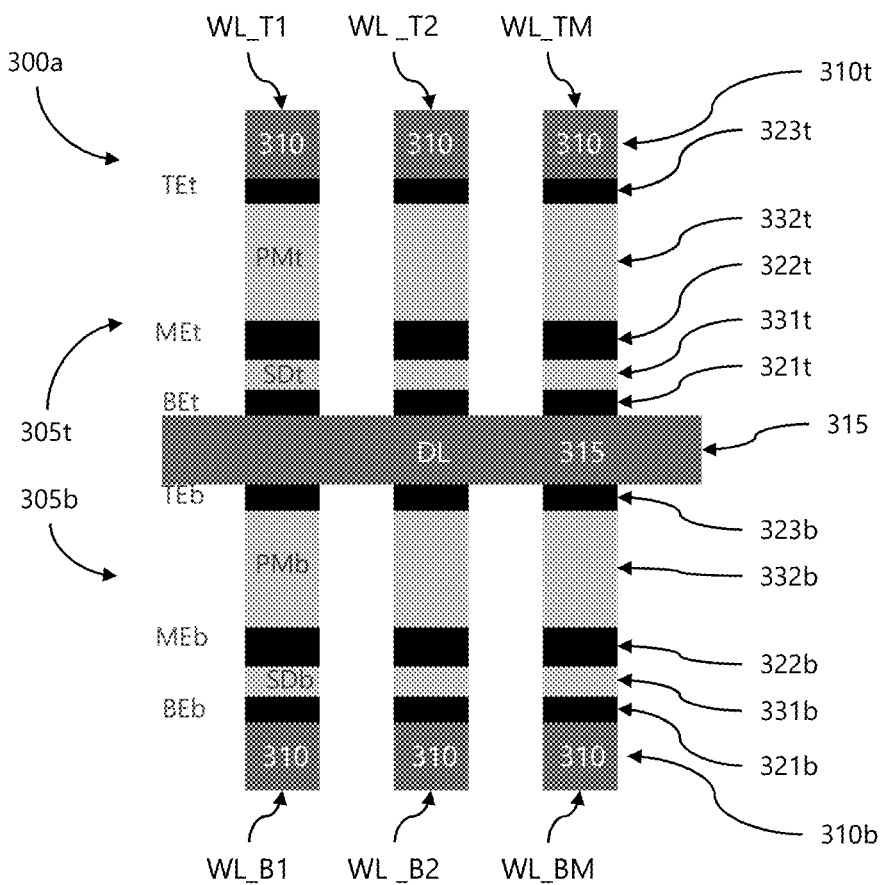
Figure 3B:
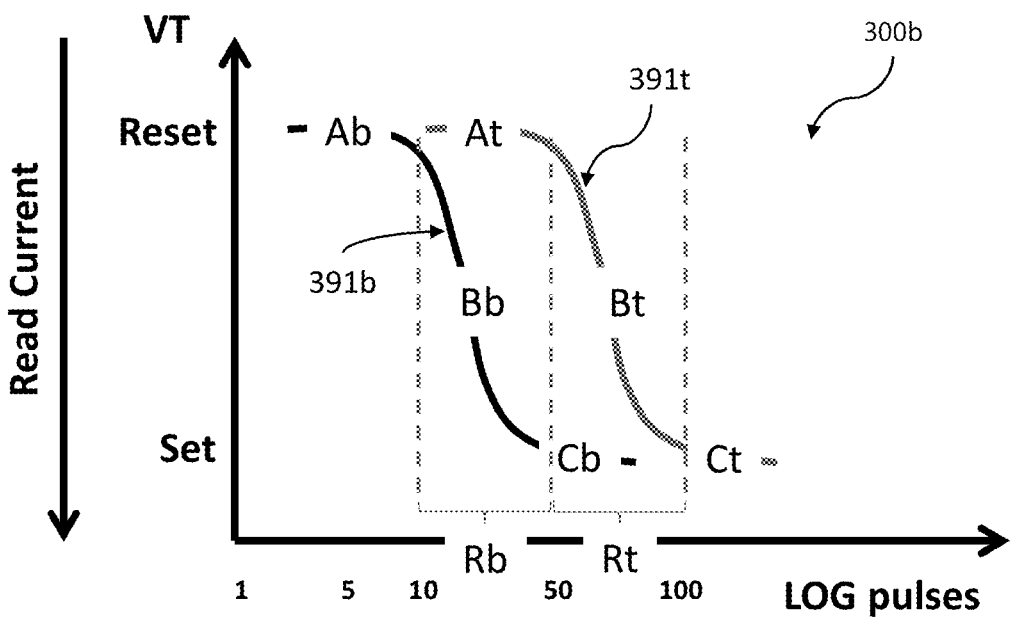

FIG. 3a illustrates an example of a three-dimensional memory array that supports analog storage using a memory device in accordance with embodiments of the present disclosure and FIG. 3b illustrates a diagram of an electrical quantity of memory cells in FIG. 3a. More specifically, FIG. 3a illustrates a portion of a memory array 300a that supports analog storage. Memory array 300a may be an example of portions of memory array 102 described with reference to FIG. 1. The drawing of FIG. 3a depicts a cross section of memory array 300a along a direction of digit line and is similar to memory array 200 in FIG. 2a. However, memory array 300a is a 3D memory array with two overlapping decks each comprising a 2D memory array. The top deck shares with the bottom deck digit line 315. More decks (not shown) may be present in some embodiments.

In the cross section of FIG. 3a, digit line (DL) 315 runs from left to right in the plane of the drawing, while word lines 310, run into the page; digit line 315 and word lines 310 may be examples of digit lines 115 and/or 215 and word lines 110 and/or 210, with reference to FIG. 1 and/or FIG. 2a. Three bottom word lines 310b (WL_B1, WL_B2 and WL_BM) and three top word lines 310t (WL_T1, WL_T2 and WL_TM) are shown, but more word lines may be present in some embodiments.

Memory cells 305b and 305t, that may be examples of memory cells 105 in FIG. 1 and/or of memory cells 205 in FIG. 2a, are placed at the crossing of word lines 310 and digit line(s) 315 and, similarly to the cells 205 described with reference to FIG. 2a, they may each include a bottom electrode (BE) 321, a selection element (SD) 331, a middle electrode (ME) 322, a storage element (MD) 332 and a top electrode (TE) 323.

In cells 305b of bottom deck, bottom electrode (BEb) 321b is between the selector element (SDb) 331b and the word line (WL_Bx) 310b; middle electrode (MEb) 322b is between the selector element (SDb) 331b and the storage element (PMb) 332b and top electrode (TEb) 323b is between storage or memory element (PMb) 332b and digit line (DL) 315. In cells 305t of top deck, bottom electrode (BEt) 321t is between the selector element (SDt) 331t and the digit line (DL) 315; middle electrode (MEt) 322t is between the selector element (SDt) 331t and the storage element (PMt) 332t and top electrode (TEt) 323t is between storage or memory element (PMt) 332t and word line (WL_Tx) 310t. In other embodiments, the relative position of the selector element and of the storage element may be exchanged.

Memory array 300a and memory cell 305 therein are operated in a similar way as arrays 102 and 200 and memory cells 105 and 205 described with reference to FIGS. 1, 2a-2c. For sake of brevity the description is not repeated here. It is understood that the aspects and concepts described above apply, mutatis mutandis, to the embodiment here described.

FIG. 3b illustrates a diagram 300b of curves 391b and 391t representing the threshold voltage (on the vertical Y-axis), or a read current (on the second vertical down-oriented Y-axis on the left) of memory cells 305b and 305t in FIG. 3a used for extended range analog storage as function of the number of programming pulses (on the horizontal X-axis, in a logarithmic scale). In a similar fashion as for memory cell 205 and as discussed with reference to FIG. 2b, a preconditioning pulse may be applied to the memory cells 305b and 305t to reset each of them in respective Ab and At reset states. The preconditioning reset pulse may be of sufficient amplitude to heat the storage material above the melting temperature and then quench it in an amorphous phase, in some embodiments. The reset states Ab and At of cells 305b and 305t may be characterized by respective high threshold voltage and high resistivity/low conductivity values. The reset threshold voltage values and resistivity/conductivity values may be different from each other for cells 305b and 305t. As described above, the two memory cells may be on different decks in some embodiments; accordingly the sense component may have different circuits to read the analog information stored in the memory cells on different decks, the reading circuits being optimized for each expected quantitative current value, for example.

Analog information programming may take place using a sequence of programming pulses applied to the memory cells (e.g., to one or more of memory cells 305b and 305t). In some applications, a same sequence of pulses is applied to memory cells 305b and 305t with different programming sensitivity, for example during a Hebbian learning phase. Each programming pulse will result in a partial programming of the memory cell. Based on the number of programming pulses received, the state of the memory cells 305b and 305t translates from point Ab or At (corresponding to the initial reset state) towards point Cb or Ct (corresponding to the respective set state of cells 305b and 305t) on curves 391b or 391t. When at intermediate states (e.g., represented by points Bb and Bt on curves 391b and 391t) memory cells 305b and 305t have a respective intermediate threshold voltage and/or an intermediate resistivity/conductivity with respect to the corresponding reset (point Ab and At) and set (point Cb and Ct) values.

The transition from respective reset to set states occurs at a different number of pulses because of the respective programming sensitivity of the cells 305b and 305t. The transition also spans different ranges Rb and Rt (e.g., the regions between vertical dashed lines represents the range of most programming sensitivity of the memory cell to programming pulses: from about 10 to about 50 pulses for memory cell 305b and from about 50 to about 100 pulses for memory cell 305t, in the example depicted in FIG. 3b). The actual number of pulses in the transition ranges Rb and Rt (e.g., the number of pulses for the threshold voltage to start/complete the transition from the reset to the set states) may depend on several factors. In some embodiments it is possible to adjust the position and width of each range acting on one or more of structural and/or electrical parameters to ensure that the two ranges are contiguous or partly overlapping. In some embodiments memory cell 30b is set (or substantially set) at the same number of pulses for which memory cell 305t starts transitioning. Often the transition occurs according to a logarithmic dependence on the number of programming pulses, as roughly depicted in FIG. 3b, but a different dependence may be observed in other examples.

A reading operation of respective memory cells, e.g., of memory cell 305b and memory cell 305t, may be carried out. The reading operation may comprise reading analog information. In some cases, reading the analog information may comprise accessing the plurality of memory cells comprises biasing respective access lines coupled to respective memory cells on different decks of a multi-deck memory array. Additionally or alternatively, reading may comprise detecting one or more signals generated on one or more respective access lines coupled to the respective memory cells based at least in part on biasing the respective access lines and determining analog values stored by the respective memory cell based at least in part on detecting the one or more signals. In some embodiments, reading may comprise detecting a sub-threshold current associated with at least one respective access line coupled to respective memory cells, for example as discussed with reference to the description of FIG. 2c, that is not here repeated for conciseness.

Memory cells 305b and 305t on bottom and top decks differ from each other in a respective programming sensitivity, according to some embodiments. In other words, memory cells 305b on the bottom deck have a first programming sensitivity, e.g., a range Rb of number of programming pulses in which the threshold voltage and/or the resistivity and/or the conductivity of the memory cells 305b changes from a corresponding reset value to a set value through intermediate threshold voltage/resistivity/conductivity values. Memory cells 305t on the top deck have a second programming sensitivity, e.g., the threshold voltage and/or the resistivity and/or the conductivity of the memory cells 305b changes from a corresponding reset value to a set value through intermediate threshold voltage/resistivity/conductivity values in a second range Rt of number of programming pulses that is different from the first range Rb of memory cells 305b in bottom deck.

In some embodiments, a first storage element 332b of a first memory cell 305b in bottom deck comprises a first storage material that is different from a second storage material in the storage element 332t (e.g., a second storage element 332t) of a second memory cell 305t on the top deck. In some examples, the first and the second storage elements 332b and 332t (respectively of the first 305b and second 305t memory cells) may comprise a first chalcogenide-based storage material and a second chalcogenide-based storage material that have a different composition. In some embodiments, composition of storage materials in storage elements 332b and 332t may differ in one or more elements constituting the material and/or in a relative percentage of elements in the material. Just to make a few non-limiting examples, one of storage elements 332b and 332t may comprise GeTe and the other may comprise InTe. Other materials may be used in forming storage materials of cells on different decks, such as SbTe, InSb, AsTe among others. In other examples, Ge—Sb—Te, alloys (also known as GST) comprising different atomic percentage compositions of Ge, Sb and/or Te may result in different programming sensitivity of the storage elements of cells on different decks of the multi-deck array. Additionally or alternatively, different doping levels of a same or similar chalcogenide storage material may result in different programming sensitivity, such as using a 3% In-doped GST alloy as storage material in a first memory cell and a 9% In-doped GST alloy as storage material in a second memory cell on a different deck of a multi-deck memory array.

In some embodiments, memory cells 305b and 305t may differ from each other in other additional or alternative aspects. For example, memory elements 332b and 332t may have a different respective thickness in some embodiments (not depicted in FIG. 3a). The thickness difference may be combined with the compositional difference discussed above, for example to optimize the overlap of programming sensitivity ranges R1 and R2, or it may be the sole or at least main difference, as it will be discussed in more detail with reference to FIGS. 5a and 5b.

Multiple decks of memory cells 305 may be formed on top of each other according to a technology similar to the one described above with reference to cells 205 of FIG. 2a. Different processing parameters may be selected for memory cells on different decks; for example storage element 332b of cells 305b in bottom deck may comprise a chalcogenide-containing material of a different composition and/or thickness than the storage element 332t of memory cells 305t of top deck, therefore resulting in memory cells 305b and 305t differing in respective programming sensitivity. It should be noted that the memory array manufacturing process easily accomodates for formation of storage materials of different material composition (and/or material thickness); as a matter of fact, storage material formation at each deck is independent of other processing steps, in particular of steps for storage material formation at different decks of a multi-deck array, so that it may be tuned as desired.

Reading circuitry coupled to the memory cells 305b and 305t may also be formed, the reading circuitry configured to read the respective memory cells and to provide an output based on a combination of respective analog information read from the respective memory cells. The reading circuitry may be formed according to one of the standard fabrication techniques, for example CMOS technology. Memory cells on different decks, e.g., memory cells with respective programming sensitivity, may be accessed during a reading phase for reading analog information programmed therein. Memory cells, e.g., both memory cells 305b in bottom deck and memory cells 305t in top deck, have similar current-voltage (I-V) characteristics to those described with reference to FIG. 2c and that are not here reported again. Analog information stored in set state, reset state and intermediate states may be read by the sense circuitry in a non-destructive way, for example by measuring a corresponding sub-threshold current (I_set, I_reset and I_int, respectively).

The reading circuitry is configured to combine the analog information read from respective cells of the analog storage unit, e.g., from a memory cell 305b and a corresponding memory cell 305t to provide an output based on the combination. For example, an analog-to-digital (A2D) converter may convert the analog read current (I_set, I_int, I_reset) into digital form with the desired precision (for example with a 4 bits encoding) for each memory cell. An output may be provided based on the combination of the two analog information (in the example depicted, but more than two decks with cells of different composition may be provided in some embodiments), e.g., the combination of the 4-bits corresponding to each memory cell of the analog storage unit; the total programming sensitivity range is greatly increased as it spans Rb and Rt (note that there is a logarithmic sensitivity to the number of programming pulses).

The analog storage unit comprising memory cells with different programming sensitivity may be trained during a learning phase, for example a Hebbian training, by accessing the memory cells 305b and 305t in the analog storage unit and applying one or more programming pulses. The same programming pulses may be applied to the memory cells of the analog storage unit. Since each memory cell has a different programming sensitivity, storing the analog information in respective memory cells comprises changing states of each respective memory cell at a respective rate different from other respective state change rates of other respective memory cells in response to applying the one or more programming pulses to the memory cells. In other words, the different memory cells in the analog storage unit are programmed to different states based on the respective programming sensitivity.

Figure 4A:
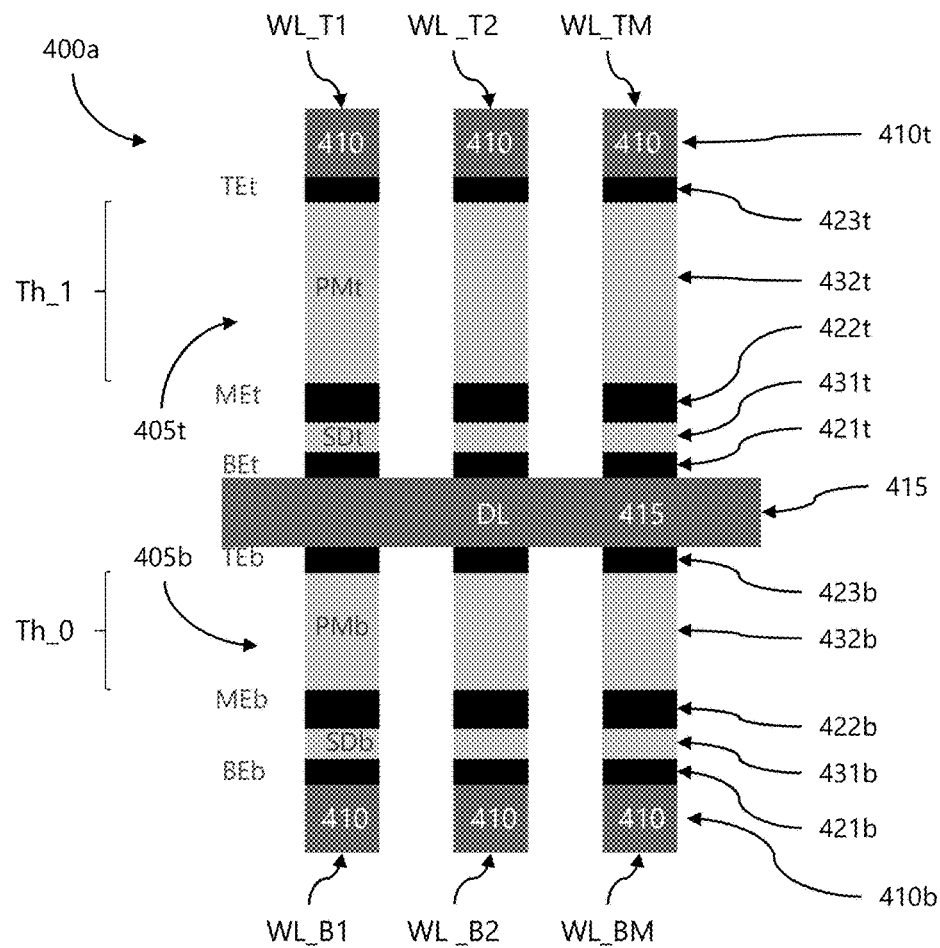
Figure 4B:
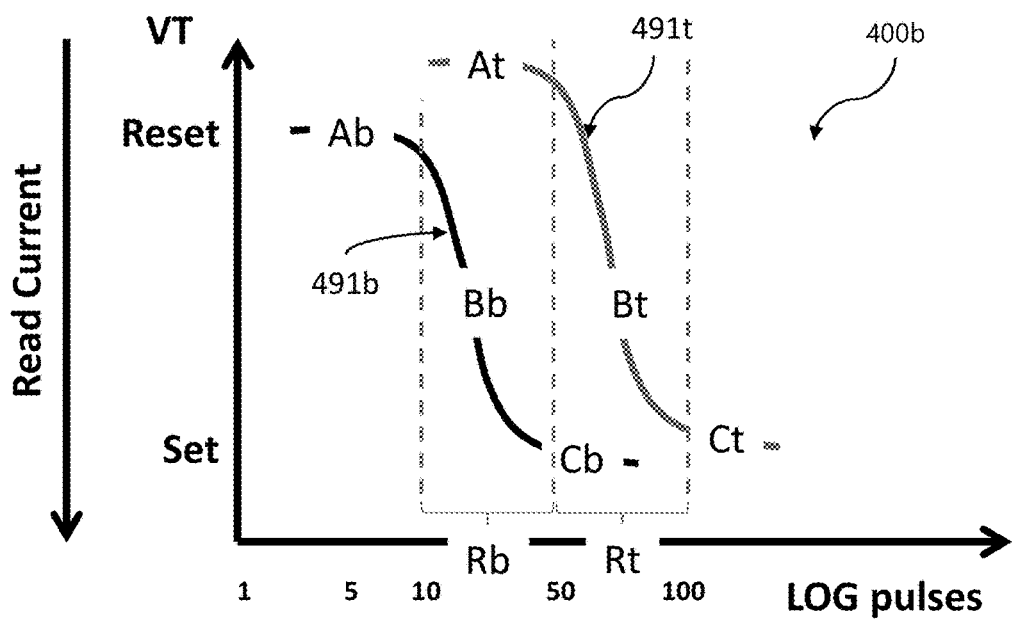

FIG. 4a illustrates an example of three-dimensional of a memory array that supports analog storage using a memory device in accordance with embodiments of the present disclosure and FIG. 4b illustrates a diagram of an electrical quantity of memory cells in FIG. 4a. More specifically, FIG. 4a illustrates a portion of a memory array 400a that supports analog storage. Memory array 400a may be an example of portions of memory array 102 described with reference to FIG. 1. The drawing of FIG. 4a depicts a cross section of memory array 400a along a direction of digit line and is similar to memory array 200 and 300a in FIGS. 2a and 3a. Memory array 400a has several aspects in common with memory array 300a, so it will be described very briefly and with reference to the description above in all the corresponding aspects.

In the cross section of FIG. 4a, digit line (DL) 415 runs from left to right in the plane of the drawing, while word lines 410, run into the page; digit line 415 and word lines 410 may be examples of digit lines 115 and/or 215 and word lines 110 and/or 210, with reference to FIG. 1 and/or FIG. 2a. Three bottom word lines 410b (WL_B1, WL_B2 and WL_BM) and three top word lines 410t (WL_T1, WL_T2 and WL_TM) are shown, but more word lines may be present in some embodiments.

Memory cells 405b and 405t, that may be examples of memory cells 105 in FIG. 1 and/or of memory cells 205 in FIG. 2a, are placed at the crossing of word lines 410 and digit line(s) 415 and, similarly to the cells 205 and 305 described with reference to FIGS. 2a and 3a, they may each include a bottom electrode (BE) 421, a selection element (SD) 431, a middle electrode (ME) 422, a storage element (MD) 432 and a top electrode (TE) 423; in each label, the letter b refers to elements/components of the bottom deck and the letter t identifies elements/components of the top deck. The main difference between memory array 400a and memory array 300a is that the storage element 432b of memory cells 405b on the bottom array comprise a storage material with a first thickness Th_0 that is different from a second thickness Th_1 of a storage material of the storage element 432t of memory cells 405t on the top array. In some embodiments, Th_0 may be in the range of 20 to 60 nm, for example about 40 nm and Th_1 may be in the range of 25 to 80 nm, for example about 50 nm, with a corresponding thickness increase in the range of 5 to 40 nm, for example of about 10 nm. In some embodiments, memory cells with significantly different programming sensitivity may be obtained with a thickness increase of the storage material of a few %. Storage material of storage elements 432b and 432t may be the same material, in some embodiments.

It has indeed been found that, even if the storage material is the same material, a storage material thickness variation may result in a difference in programming sensitivity. Correspondingly, according to some embodiments, an analog storage unit may comprise a plurality of memory cells, e.g., cells 405b and 405t on different decks of a 3D memory array 400a, with respective programming sensitivity different from the respective programming sensitivity of other memory cells in the unit. A reading circuitry, for example as it will be described in greater detail with reference to FIG. 6, may be configured to read respective analog information programmed in the respective memory cells and to provide an output based on a combination of the respective analog information read from the respective memory cells. The memory cells may respectively have a first storage element comprising a storage material with first thickness and a second storage element comprising the storage material with a second thickness that is different from the first thickness.

FIG. 4b illustrates a diagram 400b of curves 491b and 491t representing the threshold voltage (on the vertical Y-axis), or a read current (on the second vertical down-oriented Y-axis on the left) of memory cells 405b and 405t in FIG. 4a used for extended range analog storage as function of the number of programming pulses (on the horizontal X-axis, in a logarithmic scale). In a similar fashion as for memory cells 305b and 305t and as discussed with reference to FIG. 3b, a preconditioning pulse may be applied to the memory cells 405b and 405t to reset each of them in respective Ab and At reset states. The preconditioning reset pulse may be of sufficient amplitude to heat the storage material above the melting temperature and then quench it in an amorphous phase, in some embodiments.

In FIG. 4b, the reset states Ab and At of cells 405b and 405t may be characterized by respective high threshold voltage and high resistivity/low conductivity values. As depicted, the reset threshold voltage values and resistance/conductance values may be different from each other for cells 405b and 405t, based on the difference in respective thickness Th_0 and Th_1 of storage material of respective storage elements. Similarly, memory cells 405b and 405t may have different threshold voltage when in respective set state (e.g., Cb and Ct, respectively), based on the difference in respective thickness Th_0 and Th_1. Additionally, the programming sensitivity of cells 405b and 405t may be different, e.g., the respective ranges Rb and Rt in which the memory cells transition from the reset state to the set state may be different, as depicted in FIG. 4b. By forming the respective storage material on different decks of appropriate thickness (e.g., Th_0 and Th_1) it is possible to adjust the programming sensitivity so that the ranges Rb and Rt do not completely overlap and/or are not spaced apart, e.g., they are essentially adjacent to each other. For example, in some embodiments, memory cell 40b is set (or substantially set) at the same number of pulses for which memory cell 405t starts transitioning from reset to set state. More than two memory cells may be provided in the same analog storage unit, for example providing 4, 8, or more decks of memory cells each with storage element comprising a storage material of a different thickness, in some embodiments.

It has further been found that a difference in programming sensitivity may be obtained, in some embodiments, in memory cells on different decks of a 3D memory array, such as a 3D cross-point memory array similar to the one depicted in FIGS. 3a and 4a, having storage elements with a same storage material and with a same thickness, the memory cells on decks of different parity, e.g., memory cells on a first deck and on a second deck adjacent to the first deck. Referring again to the drawing in FIG. 3a, consider, for example, memory cell 305b (on bottom deck) and memory cell 305t (on top deck, that is adjacent to the bottom deck, or immediately subsequent to it in the 3D array, e.g., with a different parity) in the case in which a storage material of the respective storage elements 332b and 332t is a same material and has a same thickness. Without being bound by any theory, a different thermal profile may be established in the memory cells 305b and 305t, and in particular in the respective storage elements 332b and 332t, during the application of programming pulses between the corresponding word line and bit line. For example, the programming response of memory cells 305b and 305t may be different under a same programming pulse, e.g., a same voltage difference applied between bottom word line WL_B1 310 and shared digit line DL 315 and applied between top word line WL_T1 310 and shared digit line DL 315.

Stated differently, during a programming pulse, a programming current may flow through the memory cells from the digit line (e.g., DL 315 in FIG. 3a) to the word line (e.g., WL_Bx in one of the cells 305b of bottom deck, or WL_Tx in one of the cells 305t of top deck) when a positive programming pulse is applied (e.g., a higher voltage is applied to the digit line with respect to the voltage applied to the word line). As depicted in FIG. 3a, the current flows through respective cells 305b and 305t, that have different internal structure orientation with respect to the direction of the current. Moreover, the storage element 332b is closer to digit line DL 315 than to word line WL_Bx 310b in bottom cell 305b, while the storage element 332t is closer to word line WL_Tx 310t than digit line DL 315 in top memory cell 305t. Possibly based on these differences, nucleation and crystal growth rates may be different in bottom 305b and top 305t memory cells, resulting in different programming sensitivities (e.g., different ranges Rb and Rt for transitioning from reset Ab and At to set Cb and Ct states).

Accordingly, a device or analog storage memory unit is provided comprising a plurality of memory cells (305b and 305t) each respective memory cell with a respective programming sensitivity (Rb and Rt) different from the respective programming sensitivity (Rt and Rb) of other memory cells (305t and 305b, respectively). The memory cells 305b and 305t may be on different decks of a multi-deck memory array. A first memory cell 305b in the analog storage unit may have a first middle electrode 322b between a first word line WL_Bx 310b and a first digit line DL 315, a first selection element 331b between the first word line WL_Bx 310b and the first middle electrode 322b, and a first storage element 332b between the first middle electrode 322b and the first digit line DL 315, the first storage element 332b having a first thickness and a first composition; a second memory cell 305t in the analog storage unit may have a second middle electrode 322t between a second digit line DL 315 and a second word line WL_Tx 310t, a second selection element 331t between the second digit line DL 315 and the second middle electrode 322t, and a second storage element 332t between the second middle electrode 322t and the second word line WL_Tx 310t, wherein the second storage element 332t has a second thickness equal to the first thickness and a second composition equal to the first composition. The device may also comprise a reading circuitry configured to read respective analog information programmed in the respective memory cells and to provide an output based on a combination of the respective analog information read from the respective memory cells. Reading the respective analog information may be carried out by a non-destructive reading, such as a current measurement under sub-threshold voltage biasing, in some examples. The analog information may have been programmed in the memory cells 305b and 305t applying a same sequence of programming pulses during a Hebbian learning phase.

Figure 5A:
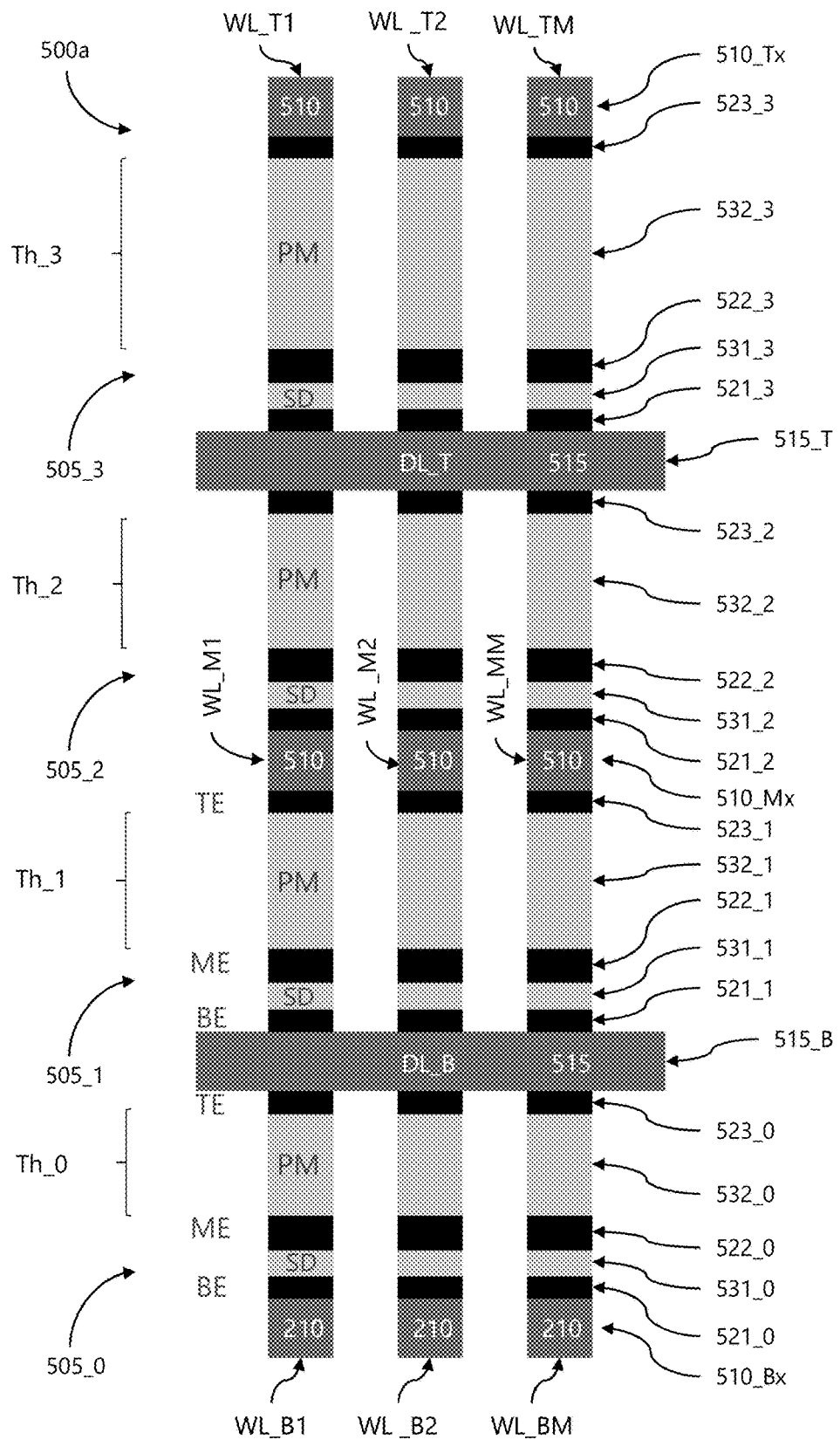
Figure 5B:
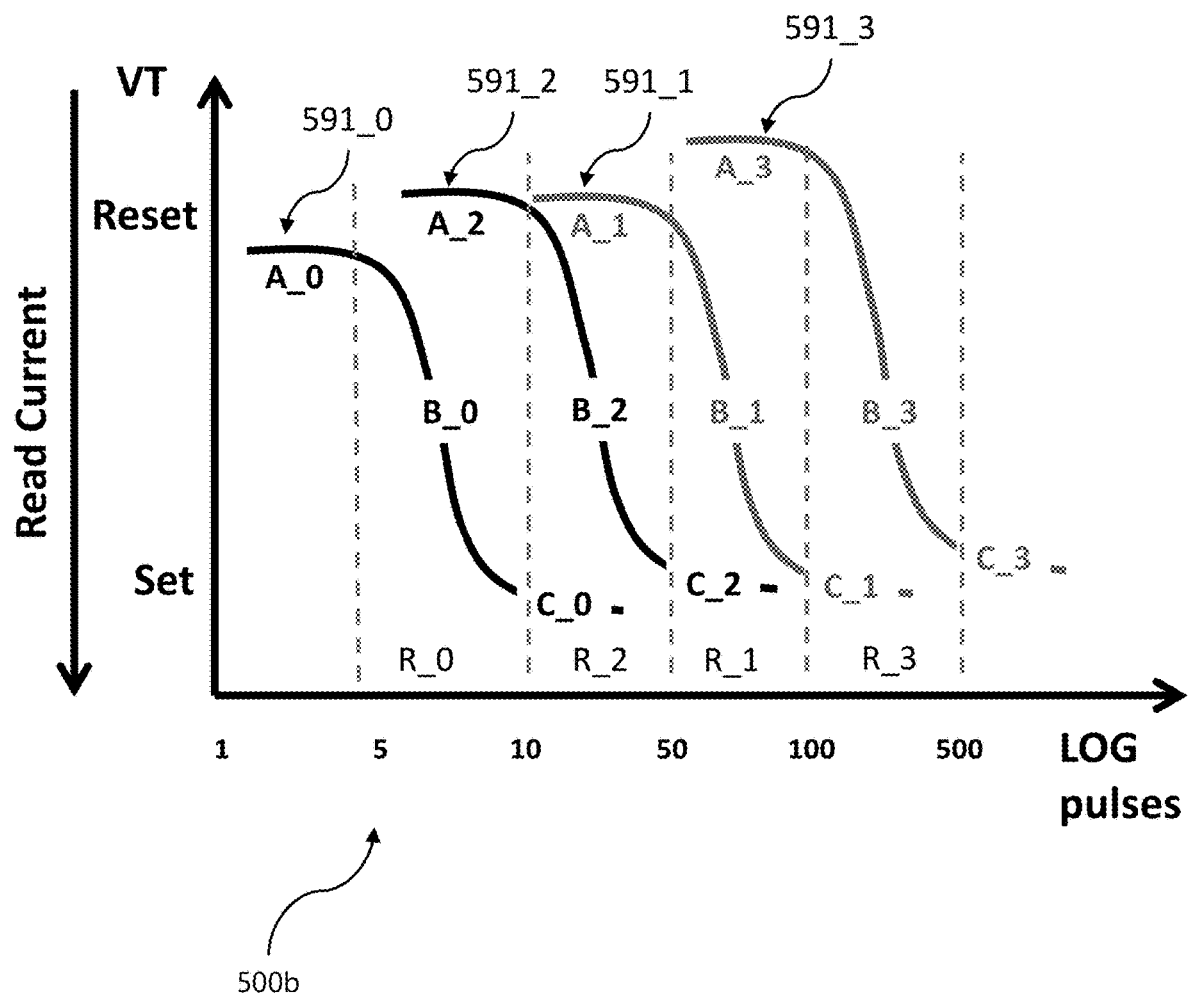

FIG. 5a illustrates an example of a three-dimensional memory array that supports analog storage using a memory device in accordance with embodiments of the present disclosure and FIG. 5b illustrates a diagram of an electrical quantity of memory cells in FIG. 5a. More specifically, FIG. 5a illustrates a portion of a memory array 500a that supports analog storage. Memory array 500a may be an example of portions of memory array 102 described with reference to FIG. 1. The drawing of FIG. 5a depicts a cross section of memory array 500a along a direction of digit lines and is similar to memory array 200, 300a and 400a in FIGS. 2a, 3a and 4a, respectively. Memory array 500a has several aspects in common with memory array 300a and/or 400a, so it will be described very briefly and with reference to the description above in all the corresponding aspects. Four decks (deck 0, deck 1, deck 2 and deck 3) are depicted in FIG. 5a, but the number of decks is not limited to this example.

In the cross section of FIG. 5a, digit lines 515 (e.g., bottom digit line DL_B 515_B shared between deck 1 and deck 2, and top digit line DL_T 515_T shared between deck 2 and deck 3) run from left to right in the plane of the drawing, while word lines 510 (e.g., bottom word lines WL_Bx 510_Bx of deck 0, middle word lines WL_Mx 510_Mx shared between decks 1 and deck 2, and top word lines WL_Tx 510_Tx of deck 3) run into the page. Digit lines 515 and word lines 510 may be examples of digit lines 115 and word lines 110, with reference to FIG. 1.

Memory cells 505_0, 505_1, 505_2 and 505_3 may be examples of memory cells 105 in FIG. 1; they are placed at the crossing of word lines 510 and digit lines 515 in respective decks (a word line and/or a digit line may be shared by adjacent decks). Adjacent decks may also be referred to ad decks of different parity, so, for example, deck 0 and deck 1 are different parity decks, as deck 1 and deck 2 or deck 2 and deck 3. Decks of same parity may be deck 0 and deck 2 or deck 1 and deck 3, for example. Similarly to the cells 205, 305 and 405 described with reference to FIGS. 2a, 3a and 4a, memory cells 505 may each include a bottom electrode (BE) 521, a selection element (SD) 531, a middle electrode (ME) 522, a storage element (PM) 532 and a top electrode (TE) 523; in each label, the letter suffix refers to elements/components of the corresponding deck (e.g., _0 for deck 0 and so on).

In memory array 500a, memory cells 505 of different decks may be characterized by a storage element comprising a storage material with respective composition, that may be the same composition or a different composition than the composition of storage materials of storage elements in memory cells of different decks. Additionally or alternatively, memory cells 505 of different decks may be characterized by a storage element comprising a storage material with respective thickness (Th_0, Th_1, Th_2 and Th_3), that may be the same thickness or a different thickness than the thickness of storage materials of storage elements in memory cells of different decks. In other words, memory cells on different decks may have respective storage elements formed of a same composition and with a same or different thickness, or they may have respective storage elements formed of a same or different composition and with a same thickness, or any combination thereof. A programming sensitivity of cells on different decks may be differentiated based on such compositional and/or thickness differences, also considering the differences that may be ascribed to different deck parities, as discussed above. By reading respective analog information programmed in the respective memory cells on different decks (and therefore with different programming sensitivity) it is possible to provide an output based on a combination of the respective analog information.

Without any limitation and just to make a few examples, in one embodiment, memory cells on one deck (for example memory cells 505_1) of memory array 500a may have a storage element of same composition and thickness as memory cells on a different deck (such as, for example, memory cells 505_2); so, in this example, composition of 532_1 and of 532_2 is the same and thickness Th_1 is the same as thickness Th_2. At the same time, memory cells in one deck (for example memory cells 505_0) may have a storage element of same composition and different thickness as memory cells on a different deck (such as, for example, memory cells 505_1); so, continuing in this example, composition of 532_0 and of 532_1 is the same while thickness Th_0 is less than thickness Th_1 and Th_2. Further, memory cells 505_3 on deck 3 may have a storage element with same composition as the composition of storage elements of all other memory cells in memory array 500a, but with a thickness Th_3 different from all of them, in particular Th_3 may be larger than Th_2, Th_1 and Th_0.

Considering the description of previous embodiments, memory cells 505_0, 505_1, 505_2 and 505_3 may all have different programming sensitivity, as it will be further discussed below with reference to FIG. 5b. As a matter of fact, memory cells 505_0 and 505_1 comprise storage elements of same material and different thickness (Th_0<Th_1), so they differ at least in view and for those aspects discussed with reference to FIGS. 4a and 4b. The same reasoning may be applied to memory cells 505_1 (and/or 505_2) and 505_3, that comprise storage elements of same material and different thickness (Th_1<Th_3 and/or Th_2<Th_3). Moreover, memory cells 505_1 and 505_2 comprise storage elements of same material and thickness (Th_1=Th_2), but they different in relative orientation with respect to a current flow direction during a programming pulse, so they differ at least in view and for those aspects discussed with reference to FIGS. 3a and 3b.

In conclusion, and with reference to FIG. 5b, memory cell 505_0 on deck 0 may have a respective programming sensitivity in range R_0, when the threshold voltage transitions from the reset state A_0 to the set state C_0 through intermediate states B_0 (e.g., from about 5 to about 10 programming pulses in FIG. 5b—curve 591_0). Memory cell 505_1 on deck 1 may have a respective programming sensitivity in range R_1, when the threshold voltage transitions from the reset state A_1 to the set state C_1 through intermediate states B_1 (e.g., from about 50 to about 100 programming pulses—curve 591_1). Memory cell 505_2 on deck 2 may have a respective programming sensitivity in range R_2, when the threshold voltage transitions from the reset state A_2 to the set state C_2 through intermediate states B_2 (e.g., from about 10 to about 50 programming pulses—curve 591_2) and memory cell 505_3 on deck 3 may have a respective programming sensitivity in range R_3, when the threshold voltage transitions from the reset state A_3 to the set state C_3 through intermediate states B_3 (e.g., from about 100 to about 500 programming pulses—curve 591_3 in FIG. 5b). Each of programming sensitivity ranges R_0-R_3 may be trimmed during the fabrication process by selecting an appropriate storage material composition and/or thickness (Th_0-Th_3), as explained above. In some embodiments, the position and width of the transition ranges R_0-R_3 may be adjusted to ensure that the ranges are contiguous or partly overlapping; said in other words, memory cell 505_0 may be set (or substantially set) at the same number of pulses for which memory cell 505_2 starts transitioning, memory cell 505_2 may be set (or substantially set) at the same number of pulses for which memory cell 505_1 starts transitioning, and memory cell 505_1 may be set (or substantially set) at the same number of pulses for which memory cell 505_3 starts transitioning, for example.

Memory cells 505_0-505_3 may be considered as part of a same analog storage unit or device and in some embodiments may be programmed with a same sequence of programming pulses during a learning phase, such as a Hebbian learning phase. Analog information may be non-destructively read from each of memory cells 505_0-505_3, e.g., measuring a current under sub-threshold biasing conditions. Memory cells 505 may be read in parallel or sequentially. An output may be provided based, at least in part, on a combination of the analog information reading. For example, measured sub-threshold current of each memory cell 505_0-505_3 may be converted into digital signal with the desired granularity and the converted digital signals may be combined.

Figure 6:
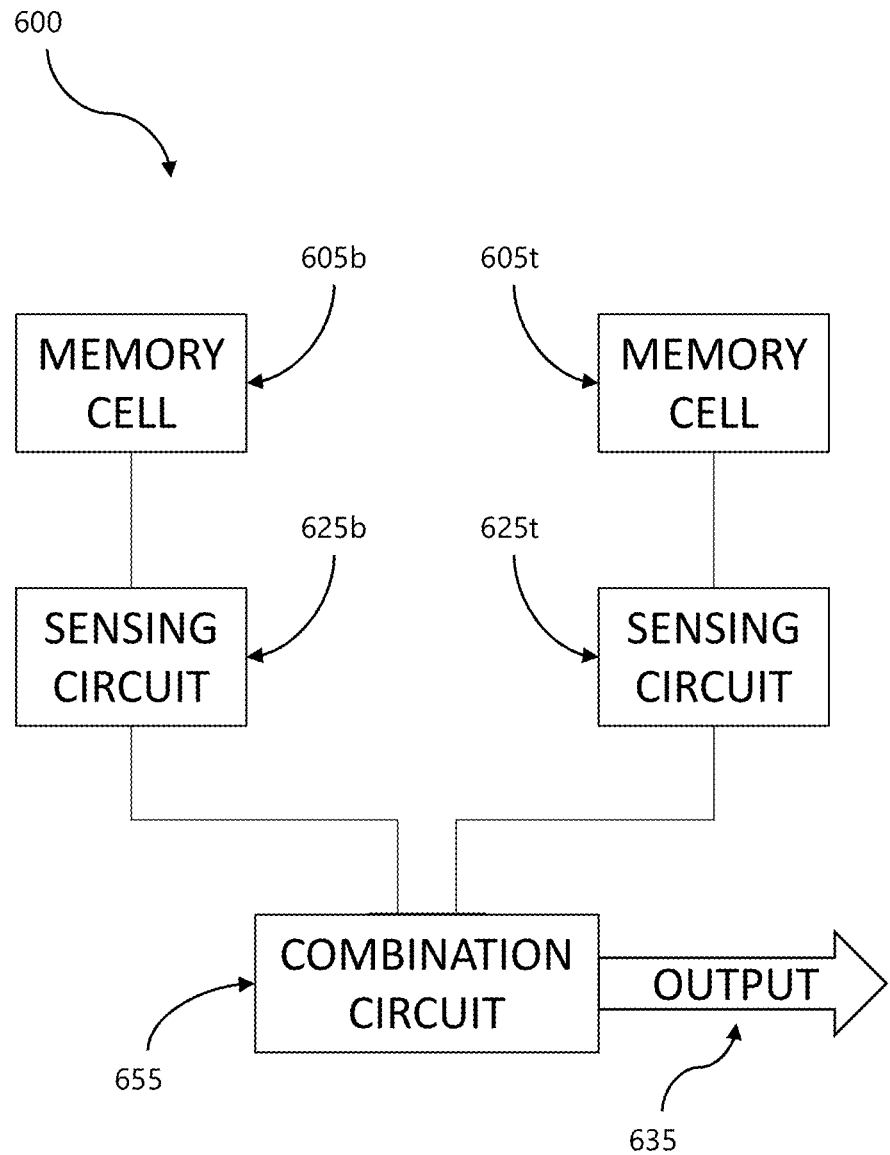
FIG. 6 illustrates an example of a read circuit that supports analog storage using a memory device in accordance with embodiments of the present disclosure.

FIG. 6 illustrates an example of a read circuit that supports analog storage using a memory device in accordance with embodiments of the present disclosure. Memory cells 605, sense circuits 625, a combination circuit 655 and output 635 are depicted in FIG. 6; they may be examples of memory cells 105, sense circuit 125 and I/O 135 in FIG. 1. Memory cells 605b and 605t may be examples of bottom 305b or 405b and top 305t or 405t memory cells, or in any case of memory cells with different programming sensitivity according to any embodiment described herein (e.g., with a storage element comprising respective storage material of different composition and/or thickness or differently placed with respect to other elements of the respective memory cell in an analog storage unit or device).

Sensing circuits 625b and 625t are respectively coupled to memory cells 605b and 605t. Sensing circuits 625 are configured to non-destructively read the analog information stored in the memory cells 605. In some embodiments, sensing circuits 625 measure a subthreshold current of memory cells 605, e.g., a current flowing through the respective cell when a bit line to word line voltage is lower than a threshold voltage of the memory cell. Sensing circuits 625 may be a sole circuit that is coupled to memory cells 605b and 605t at different times, in some embodiments.

Combination circuit 655 may combine the respective analog information read from memory cells 605b and 605t by the sense circuits 625b and 625t and provide output 635. In some embodiments, sensing circuits 625 may comprise an analog-to-digital (A2D) converter that may encode in binary digits a value representative of a sub-threshold current flowing in respective memory cells 605; as an example the reading of the analog information programmed in each of memory cells 605b and 605t may be transmitted to the combination circuit 655 in form of a string of 4 bits (or a different number of bits, in other examples with a different A2D granularity); the combination circuit 655 may then combine the two strings into a longer string of bits (e.g., a string of 8 bits), that is representative of the analog information stored in the analog memory unit as a whole. In other words, the reading circuitry 600 may be configured to read respective analog information programmed in the respective memory cells and to provide an output based on a combination of the respective analog information read from the respective memory cells.

A read operation of the analog memory unit may be configured to detect an analog value stored in the analog memory cells 605 by detecting weights (or sub-threshold currents) from the plurality of memory cells 605. The analog value may be a combination of the detected weights.

A controller (e.g., memory controller 140) may select an analog memory unit 605 for a read operation. In some cases, the controller may select one or more memory cells of the analog memory unit 605 for a read operation. The controller may also identify or select one or more digit lines and/or word lines associated with the memory cells 605.

The controller may provide an input to the memory cells 605. The input may comprise a read voltage value applied to selected memory cells, e.g., to word lines and digit lines coupled to the selected memory cells. In some cases, the word lines are all biased to the same read voltage and the digit lines are all biased to the same read voltage. In some cases, the controller may bias one or more word lines and/or one or more digit lines to a different voltage than the other word lines and/or digit lines, respectively.

The controller may detect one or more signals generated on one or more digit lines coupled with the memory cells 605. The signals may be generated based on applying the input to the word lines and the digit lines coupled with the memory cells 605. The signals may comprise current signals (e.g., I_set, I_reset and I_int). An individual signal or an individual weight may be detected on each digit line coupled with the memory cell 605.

The controller may determine the analog value stored in the analog memory unit based on the detecting the signals generated on the digit lines coupled with the memory cells. The controller may combine signals or the weights on each digit line to generate a total weight. The analog value may be based on the total weight.

Figure 7:
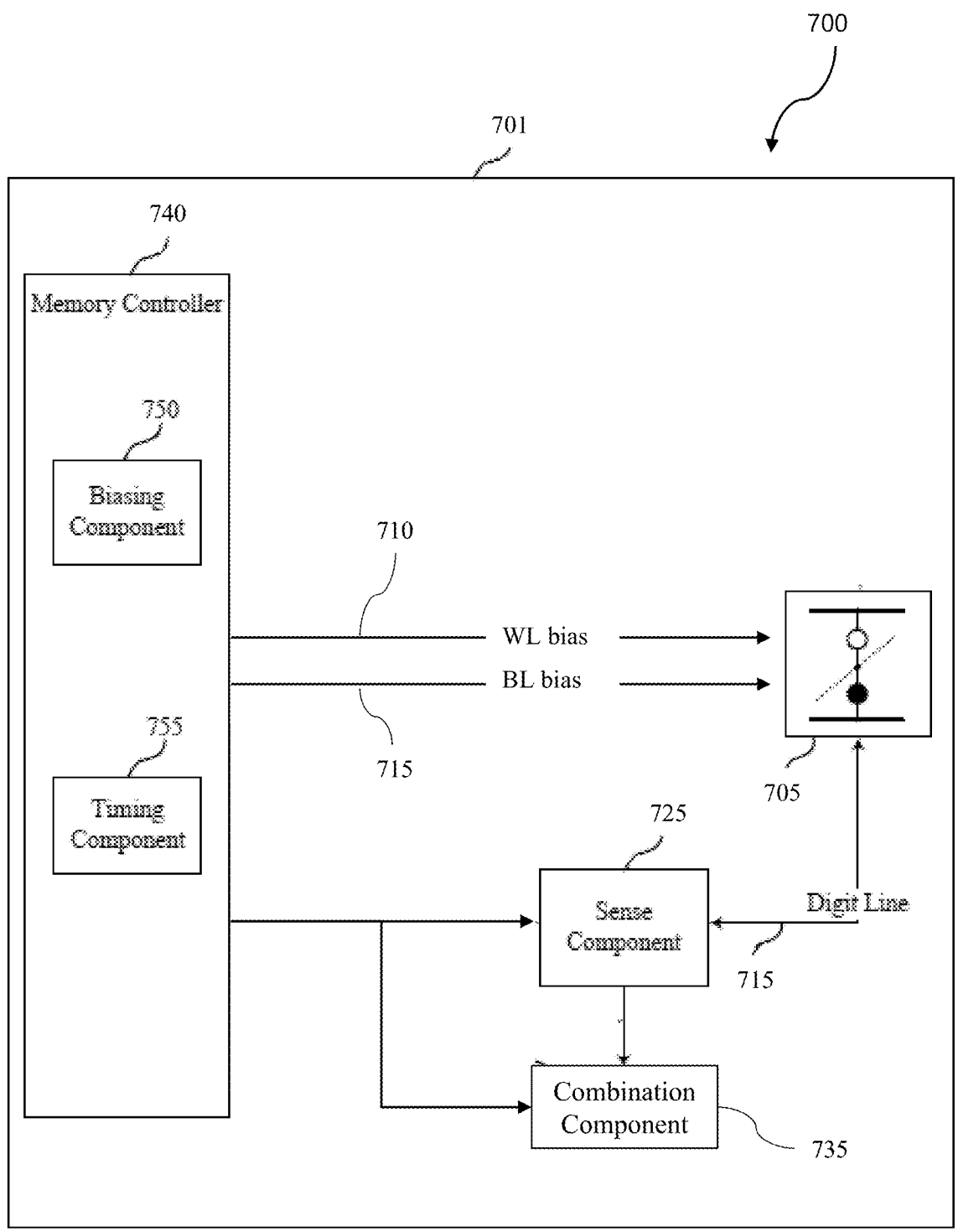
FIG. 7 shows a block diagram of a device that supports analog storage using a memory device in accordance with embodiments of the present disclosure.

FIG. 7 shows a block diagram of a device that supports analog storage using a memory device in accordance with embodiments of the present disclosure. Memory system 701 in block diagram 700 may be referred to as an electronic memory apparatus and includes memory controller 740, memory cells 705 and sense component 725, which may be examples of memory controller 140, memory cells 105 and sense component 125 described with reference to FIG. 1. Memory system 701 may also include combination component 735. The components of memory system 701 may be in electronic communication with each other and may perform the functions described with reference to FIGS. 1 through 6. In some examples, sense component 725 and combination component 735 may be components of memory controller 740.

Memory controller 740 may, in combination with other components, apply voltages throughout memory system 701, write data to memory cells 705, read data from memory cells 705, and generally operate memory system 701 as described in FIGS. 1 through 6. Memory controller 740 may include biasing component 750 and timing component 755. Memory controller 740 may be in electronic communication with word line 710, bit line 715, and sense component 725, which may be examples of a word line 110, bit line 115, and sense component 125, as described with reference to FIG. 1.

Memory controller 740 may be configured to activate word line 710 or bit line 715 by applying voltages to those various nodes. For example, biasing component 750 may be configured to apply a voltage to word line 710 and/or bit line 715 to read or write memory cell 705, as described herein. In some examples, memory controller 740 may include a row decoder, column decoder, or both, as described with reference to FIG. 1. This may enable memory controller 740 to access one or more memory cells 705. Additionally, biasing component 750 may provide voltage potentials for the operation of sense component 725 and manage combination component 735.

In some examples, memory controller 740 may perform its operations using timing component 755. For example, timing component 755 may control the timing of the various word line and/or bit line selections, including timing for switching and voltage application to perform the memory functions, such as reading and writing, discussed herein. In some examples, timing component 755 may control the operations of biasing component 750.

Memory cells 705 may have different programming sensitivity based on a composition and/or thickness of a storage material in respective storage elements. For example, memory cells located on one deck may have a first programming sensitivity and memory cells located on a different deck may have a second programming sensitivity, different from the first programming sensitivity, as in some examples described with reference to FIGS. 3a-5b. Memory cells on different decks may be grouped in analog storage units with extended programming sensitivity, as described herein.

During a programming phase, memory controller may apply a sequence of programming pulses to a plurality of memory cells 705 and modify an analog information stored therein. For example, during a Hebbian learning phase, the controller may access memory cells 705 in an analog storage unit through WL 710 and BL 715 biasing. Each respective memory cell having a respective programming sensitivity different from the respective programming sensitivity of other cells in the plurality; in some examples, the memory cells may be located on different decks of a multi-deck memory array. The controller may apply one or more programming pulses to the plurality of memory cells and store respective analog information in each respective memory cell based at least in part on the applying the one or more programming pulses. In response to applying the one or more programming pulses, each memory cell may change state at a respective rate, different from other state change rates of other memory cells, resulting in respective analog information storage. A combination of the analog information stored in memory cells of the analog memory storage unit may represent a synaptic weight, in some embodiments.

During a reading phase, sense component 725 may read analog information stored in memory cells 705 (through digit line, for example). In some examples, sense component 725 is configured to detect one or more signals generated on one or more respective access lines coupled to the respective memory cells based at least in part on biasing the respective access lines by the biasing component 750. Sense component 725 may also be configured to determine analog values stored by the respective memory cell based at least in part on detecting the one or more signals. In some cases, sense component 725 measures a current flowing through memory cells 705 when memory cells are biased under sub-threshold conditions, e.g., with a voltage difference between bit line 715 and word line 710 that is less than a threshold voltage of the memory cell 705. Sense component 725 is configured to provide the combination component 735 with analog information read from memory cells 705. In some embodiments, sense component 725 implements an analog-to-digital (A2D) encoding of the detected signals (e.g., of the sub-threshold current).

Combination component 735 is configured to receive the analog information read by sense component 725 from memory cells 705, combine the information and provide an output based on the combination of respective analog information. Memory controller 740 may cooperate with sense component 725 and combination component 735 and provide an output based on the combination of respective analog information read from memory cells 705. The output may be representative of a synaptic weight, in some examples.

Figure 8:
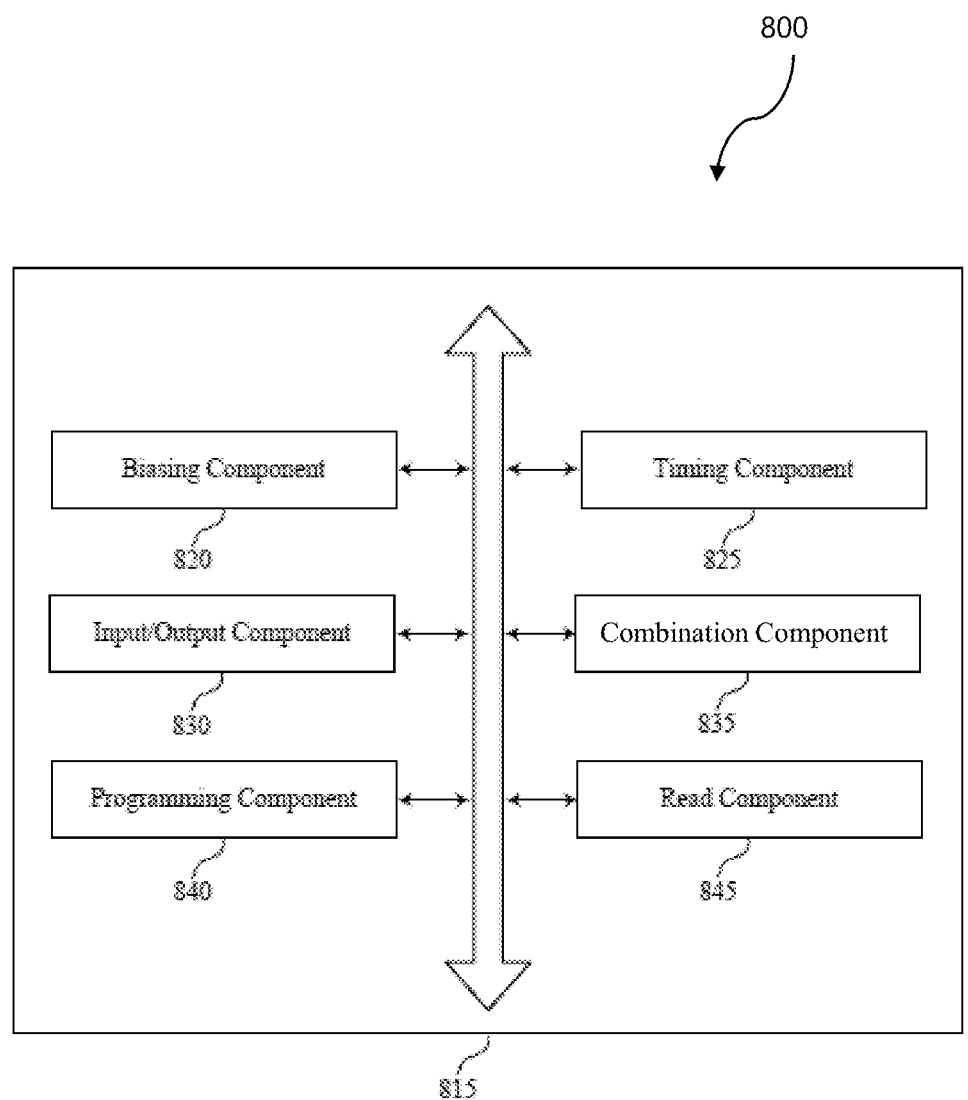
FIG. 8 shows a block diagram of a device that supports analog storage using a memory device in accordance with embodiments of the present disclosure.

FIG. 8 shows a block diagram of a device that supports analog storage using a memory device in accordance with embodiments of the present disclosure.

In block diagram 800, device 815 be implemented or executed by a controller, such as memory controller 140 described with reference to FIG. 1. The analog storage device 815 may include biasing component 820, timing component 825, Input/Output component 830, programming component 840, read component 845 and combination component 835. Each of these components may communicate, directly or indirectly, with one another (e.g., via one or more buses).

Input/Output component 830 may be an example of Input/Output 135 in FIG. 1. Commands, addresses and data may be exchanged by device 815 with other devices, such as a host device (not shown). For example, during a Hebbian learning phase, device 815 may receive through Input/Output component 830 programming instructions and data that may correspond to stimuli of a synapse. In another example, during an access phase, device 815 may receive at Input/Output component 830 read instructions and corresponding address and it may provide at Input/Output component 830 an output with the result of the access (e.g., read) operation.

Programming component 840 may access memory cells, such as memory cells 105 in FIG. 1, during a programming phase, such as an analog storage programming and/or a Hebbian learning phase. In cooperation with biasing component 820 and with timing component 825, programming component 840 may bias access lines, such as word lines 110 and bit lines 115, and apply one or more programming pulses to addressed memory cells, in some examples.

Read component 845 may select, in cooperation with biasing component 820 and timing component 825, at least one memory cell of an analog memory unit for a read operation, the memory unit including a plurality of memory cells with a respective programming sensitivity different from the programming sensitivity of other memory cells. Memory cells in the analog memory unit may be located on different decks of a multi-deck memory array, such as a 3D XPoint memory array. Memory cells may differ from each other in a respective storage element comprising storage materials of different thickness and/or composition, as described herein. Read component 845 may comprise reading circuitry configured to read respective analog information programmed in the respective memory cells.

Combination component 835 may combine the respective analog information read by read component 845 from the respective memory cells of the memory unit and provide an output based on the combination of the analog information. Combination component 835 and read component 845 may be implemented in a sole component, in some examples. The output provided by combination component 835 may be used by device 815 and/or exchanged with external devices, such as a host device (not shown), through Input/Output component 830. The output may be representative of a synaptic weight as described herein, in some examples.

Figure 9:
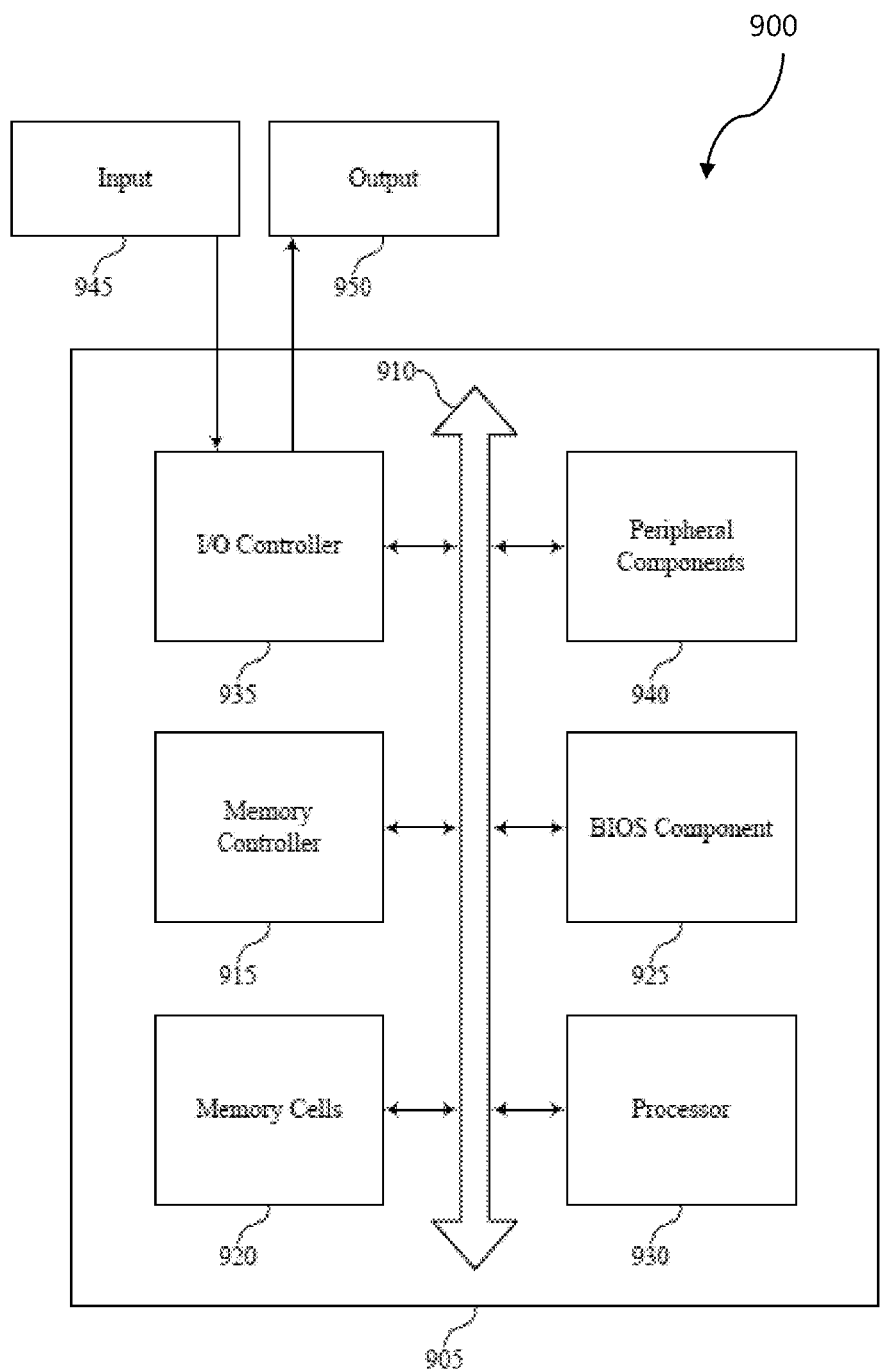
FIG. 9 shows a block diagram of a system that supports analog storage using a memory device in accordance with embodiments of the present disclosure.

FIG. 9 shows a block diagram of a system that supports analog storage using a memory device in accordance with embodiments of the present disclosure. System 900 includes a device 905, which may be or include a printed circuit board to connect or physically support various components. Device 905 may be a computer, laptop computer, notebook computer, tablet computer, mobile phone, or the like, in some examples.

Device 905 includes one or more arrays of memory cells 920, which may be an example of memory array 102 described with reference to FIGS. 1 and arrays 200, 300a, 400a and 500a in FIGS. 2-5. Memory cells may comprise analog memory units including pluralities of memory cells with respective programming sensitivity different from the respective programming sensitivity of other memory cells in the unit. In some embodiments, memory cells 920 may comprise examples of memory cells 105, 205, 305b, 305t, 405b, 405t, 505_0, 505_1, 505_2 and/or 505_3, as described in the preceding figures or in accordance with other embodiments of this application. For example, memory cells of an analog storage unit may be located on different decks of a multi deck memory array and they may comprise respective storage elements with storage material of different thickness and/or composition, as described herein.

Device 905 may also include a memory controller 915, a processor 930, BIOS component 925, peripheral component(s) 940, and input/output (I/O) controller 935. The components of device 905 may be in electronic communication with one another through bus 910.

Processor 930 may be configured to operate memory array 920 through memory controller 915. In some cases, processor 930 may perform the functions of memory controller 140 described with reference to FIG. 1. In other cases, memory controller 140 and/or 915 may be integrated into processor 930. Processor 930 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components, and processor 930 may perform various functions described herein, including analog storage and retrieval, such as synaptic weight storage and reading. Processor 930 may, for example, be configured to execute computer-readable instructions stored in memory array 920 to cause device 905 perform various functions or tasks, including neural mimicking processing.

BIOS component 925 may be a software component that includes a basic input/output system (BIOS) operated as firmware, which may initialize and run various hardware components of system 900. BIOS component 925 may also manage data flow between processor 930 and the various components, e.g., peripheral components 940, input/output controller 935, etc. BIOS component 925 may include a program or software stored in read-only memory (ROM), flash memory, or any other non-volatile memory.

Peripheral component(s) 940 may be any input or output device, or an interface for such devices, that is integrated into device 905. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots.

Input/output controller 935 may manage data communication between processor 930 and peripheral component(s) 940, input devices 945, or output devices 950. Input/output controller 935 may also manage peripherals not integrated into device 905. In some cases, input/output controller 935 may represent a physical connection or port to the external peripheral.

Input 945 may represent a device or signal external to device 905 that provides input to device 905 or its components. This may include a user interface or interface with or between other devices. In some cases, input 945 may be a peripheral that interfaces with device 905 via peripheral component(s) 940 or may be managed by input/output controller 935.

Output 950 may represent a device or signal external to device 905 configured to receive output from device 905 or any of its components. Examples of output 950 may include a display, audio speakers, a printing device, another processor or printed circuit board, etc. In some cases, output 950 may be a peripheral that interfaces with device 905 via peripheral component(s) 940 or may be managed by input/output controller 935.

The components of memory controller 915, device 905, and memory cells 920 may be made up of circuitry designed to carry out their functions. This may include various circuit elements, for example, conductive lines, transistors, capacitors, inductors, resistors, amplifiers, or other active or inactive elements, configured to carry out the functions described herein.

FIGS. 10-12 illustrate methods for analog storage using a memory device in accordance with embodiments of the present disclosure.

FIG. 10 shows a flowchart illustrating a method 1000 for analog storage; in some embodiments analog storage may be used for synaptic weight storage, for example in the context of neural mimicking electronic processing. The operations of method 1000 may be implemented by a controller or its components as described herein. For example, the operations of method 1000 may be performed by a memory controller 140, 740 and/or 915 as described with reference to FIG. 1, FIG. 7 and/or FIG. 9. In some examples, a controller may execute a set of codes to control the functional elements of the device to perform the functions described below. Additionally or alternatively, the controller may perform aspects of the functions described below using special-purpose hardware.

At 1010 the controller may access a plurality of memory cells each respective memory cell in the plurality of memory cells with a respective programming sensitivity different from the respective programming sensitivity of other cells in the plurality. The operations of 1010 may be performed according to the methods described herein. In certain examples, aspects of the operations of 1010 may be performed by a programming component 840 as described with reference to FIG. 8.

At 1020 the controller may apply one or more programming pulses to the plurality of memory cells. The operations of 1020 may be performed according to the methods described herein. In certain examples, aspects of the operations of 1020 may be performed by a programming component 840 as described with reference to FIG. 8.

At 1030 the controller may store respective analog information in each respective memory cell based at least in part on the applying the one or more programming pulses. The operations of 1030 may be performed according to the methods described herein. In certain examples, aspects of the operations of 815 may be performed by a programming component 840 as described with reference to FIG. 8.

In some embodiments, operations 1010-1030 may be performed after preconditioning the plurality of memory cells to an amorphous memory state. In some embodiments, accessing the plurality of memory cells comprises biasing respective access lines, e.g., word lines and digit lines, coupled to respective memory cells on different decks of a multi-deck memory array. In some embodiments, storing respective analog information comprises changing state of each respective memory cell at a respective rate different from other respective state change rates of other respective memory cells in response to applying the one or more programming pulses to the plurality of memory cells. In some embodiments, storing a synaptic weight value may be based on storing respective analog information in each respective memory cell.

An apparatus for performing the method 1000 is described. The apparatus may include means for accessing a plurality of memory cells each respective memory cell in the plurality of memory cells with a respective programming sensitivity different from the respective programming sensitivity of other cells in the plurality, means for applying one or more programming pulses to the plurality of memory cells, and means for storing respective analog information in each respective memory cell based at least in part on the applying the one or more programming pulses.

Another apparatus for performing the method 1000 is described. The apparatus may include a plurality of memory cells and a memory controller in electronic communication with the memory cells, wherein the memory controller is operable to access at least one memory cell of an analog memory unit for a write operation, the analog memory unit comprising a plurality of memory cells with a respective programming sensitivity different from the respective programming sensitivity of other cells in the plurality, to apply one or more programming pulses to the plurality of memory cells, and to store respective analog information in each respective memory cell based at least in part on the applying the one or more programming pulses.

Some examples of the method and apparatus described above may further comprise processes, features, means, or instructions for biasing respective access lines coupled to respective memory cells on different decks of a multi-deck memory array. In some examples of the method and apparatus described above, memory cells in an analog storage unit may comprise storage elements differing from each other in a storage material composition and/or thickness or in a relative disposition with respect to other elements of the respective memory cells (e.g., electrodes and/or select element). In some examples of the method and apparatus described above, the storing respective analog information may comprise changing states of each respective memory cell at a respective rate different from other respective state change rates of other respective memory cells in response to applying the one or more programming pulses to the plurality of memory cells. In some examples of the method and apparatus described above, a respective rate of change may be based on a respective composition and/or thickness of a memory material in a respective memory element of the memory cells. Some examples of the method and apparatus described above may further comprise processes, features, means, or instructions for preconditioning the plurality of memory cells to an amorphous memory state. Some examples of the method and apparatus described above may further comprise processes, features, means, or instructions for storing a synaptic weight value based on storing respective analog information in each respective memory cell. In some examples of the method and apparatus described above, the synaptic weight may be represented by a composition of analog information stored in a respective memory cell of the unit. In some examples of the method and apparatus described above, the one or more programming pulses may be applied to the plurality of memory cells in parallel during a training phase, such as a Hebbian learning phase.

FIG. 11 shows a flowchart illustrating a method 1100 for analog storage using a memory device in accordance with embodiments of the present disclosure. The operations of method 1100 may be implemented by a controller or its components as described herein. For example, the operations of method 1100 may be performed by a memory controller 140, 740 and/or 915 as described with reference to FIG. 1, FIG. 7 and/or FIG. 9. In some examples, a controller may execute a set of codes to control the functional elements of the device to perform the functions described below. Additionally or alternatively, the controller may perform aspects of the functions described below using special-purpose hardware.

At 1110 the controller may access a plurality of memory cells each respective memory cell in the plurality of memory cells with a respective programming sensitivity different from the respective programming sensitivity of other cells in the plurality. The operations of 1110 may be performed according to the methods described herein. In certain examples, aspects of the operations of 1110 may be performed by a read component as described with reference to FIG. 8.

At 1120 the controller may read from each respective memory cell analog information programmed in the respective memory cells. The operations of 1120 may be performed according to the methods described herein. In certain examples, aspects of the operations of 1120 may be performed by a read component as described with reference to FIG. 8.

At 1130 the controller may combine the analog information read from each respective memory cell. The operations of 1130 may be performed according to the methods described herein. In certain examples, aspects of the operations of 1130 may be performed by a combination component in cooperation with a read component as described with reference to FIG. 8.

At 1140 the controller may provide an output based on combining the analog information. The operations of 1140 may be performed according to the methods described herein. In certain examples, aspects of the operations of 1140 may be performed by a combination component, possibly in cooperation with a I/O component, as described with reference to FIG. 8.

An apparatus for performing the method 1100 is described. The apparatus may include means for accessing at least one memory cell of an analog memory unit for a read operation, the analog memory unit comprising plurality of memory cells with a respective programming sensitivity different from the respective programming sensitivity of other cells in the plurality, means for reading from each respective memory cell analog information programmed in the respective memory cells, means for combining the analog information read from each respective memory cell and means for providing an output based on combining the analog information.

Another apparatus for performing the method 1100 is described. The apparatus may include a memory cell and a memory controller in electronic communication with the memory cell, wherein the memory controller is operable to select at least one memory cell of an analog memory unit for a read operation, the analog memory unit comprising plurality of memory cells with a respective programming sensitivity different from the respective programming sensitivity of other cells in the plurality, means for reading from each respective memory cell analog information programmed in the respective memory cells, means for combining the analog information read from each respective memory cell and means for providing an output based on combining the analog information.

Some examples of the method and apparatus described above may further include processes, features, means, or instructions for detecting one or more signals generated on one or more respective access lines coupled to the respective memory cells based at least in part on biasing the respective access lines. In some cases, the processes, features, means, or instructions are configured for determining analog values stored by the respective memory cell based at least in part on detecting the one or more signals and/or detecting a sub-threshold current associated with at least one respective access line coupled to respective memory cells (e.g., performing a non-destructive reading of the memory cells).

Some examples of the method and apparatus described above may further include processes, features, means, or instructions for biasing a first word line and a first digit line of a first memory cell with a first programming sensitivity, and for biasing a second word line and a second digit line of a second memory cell with a second programming sensitivity different from the first programming sensitivity; more than two memory cells may be present in some embodiments. A difference in programming sensitivity may be based on a different composition and/or thickness of a storage material comprised in respective storage elements of the first and second memory cells and the memory cells may be on different decks of a multi-deck memory array, in some embodiments. The processes, features, means, or instructions may be configured for reading from each memory cell a corresponding analog information stored therein and for providing an output based on the combination of the analog information read.

FIG. 12 shows a flowchart illustrating a method 1200 for analog storage using a memory device in accordance with embodiments of the present disclosure. The operations of method 1200 may be implemented during a manufacturing phase as described herein. For example, the operations of method 1100 may be performed to form memory arrays 200, 300a, 400a and/or 500a, as described with reference to FIG. 2, FIG. 3a, FIG. 4a and FIG. 5a. In some examples, memory arrays 200, 300a, 400a and/or 500a may be formed over a semiconductor substrate, such as a Silicon wafer; however, other substrates are possible.

At 1210 a plurality of memory cells is formed, each respective memory cell in the plurality of memory cells with respective programming sensitivity different from the respective programming sensitivity of other memory cells in the plurality. The operations of 1210 may be performed using formation techniques such as material deposition. Examples of material deposition (e.g., conductive and/or insulating layer depositions) include chemical vapor deposition (CVD), physical vapor deposition (PVD), atomic layer deposition (ALD), molecular beam epitaxy (MBE) and other deposition techniques. The operations of 1210 may be performed also using photolithography techniques to define patterns, in some examples. The operations of 1210 may be performed also using selective or unselective removal techniques, such as dry-etching and/or wet-etching techniques, among others, and cleaning techniques. The operations of 1210 may be performed also using other semiconductor processing techniques, such as chemical mechanical polishing (CMP), thermal treatments, etc.

At 1220 reading circuitry coupled to the plurality of memory cells is formed, the reading circuitry configured to read the respective memory cells and to provide an output based on a combination of respective analog information read from the respective memory cells. The operations of 1220 may be performed according to semiconductor manufacturing processing, such as CMOS integrated circuits fabrication techniques, according to embodiments described herein. In some examples, the reading circuitry comprises a read component and a combination component as described with reference to FIG. 8. Other components and circuits may be formed in a device on a Silicon wafer.

Remaining method blocks depicted in FIG. 12, represented in dashed boxes and lines, comprise additional optional method steps according to some embodiments. At 1230, according to one embodiment, forming the plurality of memory cells comprises forming a multi-deck memory array, the respective memory cells being on different decks of the multi-deck memory array. For example, with reference to FIG. 3a and FIG. 4a, a (at least) two deck memory array 300a/400a is formed wherein memory cells 305b/405b and 305t/405t are on bottom deck and on top deck, respectively. More than 2 decks are possible. For example, with reference to FIG. 5a, a four decks memory array 500a is formed wherein memory cells 505_0, 505_1, 505_2 and 505_3 are on decks 0, deck 1, deck 2 and deck 3, respectively. More or less decks are possible.

Additionally, at 1240, for each deck of the multi-deck memory array may be optionally formed a bottom access line material, a top access line material and a storage element material between the bottom and the top access line materials, the storage element material comprising chalcogenide. The bottom access line may be a word line and the top access line may be a bit line in some cases, e.g., in decks of a first parity, or vice-versa the bottom access line may be a bit line and the top access line may be a word line in other cases, e.g., in decks with a different parity than the first parity. A selection element material may also be formed between the storage element material and the top access line. In some cases, e.g., depending on a parity of a deck, the selection element material may be coupled between the storage element material and the word line or it may be coupled between the storage element material and the bit line of the cell.

Additionally, at 1250, forming the storage element material for one deck in the multi-deck memory array may optionally comprise forming a respective chalcogenide-containing material that has a thickness and/or a composition different from another thickness or composition of a respective chalcogenide-containing material of another deck in the multi-deck memory array.

In other words, memory cells are formed with respective programming sensitivity different from each other. Consider, for example, memory cells 305b/405b and 305t/405t on bottom and top decks of arrays 300a and 400a. The programming sensitivity may differ, for example, based on a respective storage element (332b/432b and 332t/432t) of memory cells 305b/405b and 305t/405t comprising a storage material of different thickness and/or composition. Similar considerations apply to the example 4 decks memory array 500a in FIG. 5a, considering memory cells 505_0, 505_1, 505_2 and 505_3 on decks=, deck 1, deck 2 and deck 3, respectively. Reading circuitry is also formed, for example as described with reference to FIG. 6, the reading circuitry configured to read the respective memory cells, and in particular an analog information stored therein. In some embodiments a non destructive reading may be performed by the reading circuitry, such as a current measurement in sub-threshold biasing conditions. The reading circuitry, in cooperation with combination circuitry, also fabricated according to the description herein, may combine the analog information read from the memory cells of an analog storage unit and provide an output based on the combination. In some cases, the output may be representative of a synaptic weight stored in the analog memory unit during a training process, such as a Hebbian learning phase, as described above.

It should be noted that the methods described above describe possible implementations, and that the operations and the steps may be rearranged or otherwise modified and that other implementations are possible. Furthermore, embodiments from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The term "electronic communication" and "coupled" refer to a relationship between components that support electron flow between the components. This may include a direct connection between components or may include intermediate components. Components in electronic communication or coupled to one another may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication or may be coupled regardless of the state of the switch (i.e., open or closed).

As used herein, the term "substantially" means that the modified characteristic (e.g., a verb or adjective modified by the term substantially) need not be absolute but is close enough so as to achieve the advantages of the characteristic.

As used herein, the term "electrode" may refer to an electrical conductor, and in some cases, may be employed as an electrical contact to a memory cell or other component of a memory array. An electrode may include a trace, wire, conductive line, conductive layer, or the like that provides a conductive path between elements or components of memory array.

Chalcogenide materials may be materials or alloys that include at least one of the elements S, Se, and Te. Phase change materials discussed herein may be chalcogenide materials. Chalcogenide materials may include alloys of S, Se, Te, Ge, As, Al, Sb, Au, indium (In), gallium (Ga), tin (Sn), bismuth (Bi), palladium (Pd), cobalt (Co), oxygen (O), silver (Ag), nickel (Ni), platinum (Pt). Example chalcogenide materials and alloys may include, but are not limited to, Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, or Ge—Te—Sn—Pt. The hyphenated chemical composition notation, as used herein, indicates the elements included in a particular compound or alloy and is intended to represent all stoichiometries involving the indicated elements. For example, Ge—Te may include $Ge_xTe_y$, where x and y may be any positive integer. Other examples of variable resistance materials may include binary metal oxide materials or mixed valence oxide including two or more metals, e.g., transition metals, alkaline earth metals, and/or rare earth metals. Embodiments are not limited to a particular variable resistance material or materials associated with the memory elements of the memory cells. For example, other examples of variable resistance materials can be used to form memory elements and may include chalcogenide materials, colossal magnetoresistive materials, or polymer-based materials, among others.

The term "isolated" refers to a relationship between components in which electrons are not presently capable of flowing between them; components are isolated from each other if there is an open circuit between them. For example, two components physically connected by a switch may be isolated from each other when the switch is open.

As used herein, the term "shorting" refers to a relationship between components in which a conductive path is established between the components via the activation of a single intermediary component between the two components in question. For example, a first component shorted to a second component may exchange electrons with the second component when a switch between the two components is closed. Thus, shorting may be a dynamic operation that enables the flow of charge between components (or lines) that are in electronic communication.

The devices discussed herein, including memory device, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A transistor or transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a digital signal processor (DSP) and a microprocessor, multiple microprocessors, one or more microprocessors in conjunction with a DSP core, or any other such configuration).

The functions described herein may be implemented in hardware, software executed by a processor, firmware, or any combination thereof If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

The invention claimed is:

1. A device, comprising:
    a multi-deck memory array;
    a plurality of respective memory cells, each memory cell in the respective memory cells having a programming sensitivity different from programming sensitivities of other memory cells in the respective memory cells, wherein the respective memory cells being on different decks of the multi-deck memory array; and
    reading circuitry configured to read respective analog information programmed in the respective memory cells and to provide an output based on a combination of the respective analog information read from the respective memory cells, wherein the respective memory cells include a first memory cell and a second memory cell, comprising of different storage material;
    a first storage element of the first memory cell comprises a first storage material; and a second storage element of the second memory cell comprises a second storage material different from the first storage material.

2. The device of claim 1, a first storage element of the first memory cell comprises a storage material with first thickness; and a second storage element of the second memory cell comprises the storage material with a second thickness that is different from the first thickness.

3. The device of claim 1, wherein the respective memory cells comprise:
    a first memory cell comprising:
        a first middle electrode between a first word line and a first digit line;
        a first selection element between the first word line and the first middle electrode; and
        a first storage element between the first middle electrode and the first digit line, the first storage element having a first thickness and a first composition; and
    a second memory cell comprising:
        a second middle electrode between a second digit line and a second word line;
        a second selection element between the second digit line and the second middle electrode; and
        a second storage element between the second middle electrode and the second word line, the second storage element having a second thickness equal to the first thickness and a second composition equal to the first composition.

4. The device of claim 1, wherein the reading circuitry is configured to read respective analog information based at least in part on a respective resistance, a respective conductance or a respective threshold voltage of the respective memory cells.

5. The device of claim 4, wherein the reading circuitry is configured to non-destructively read respective analog information programmed in the respective memory cells.

6. The device of claim 1, wherein each respective memory cell in the plurality of memory cells is configured to change state at a respective rate different from other respective state change rates of other respective memory cells in response to one or more programming pulses applied to the memory cells during an analog programming operation.

7. The device of claim 1, wherein the plurality of memory cells is configured to store a synaptic weight.

8. A method comprising:
    accessing a plurality of memory cells in a multi-deck memory array, each respective memory cell in the plurality of memory cells having a programming sensitivity different from programming sensitivities of other cells in the plurality of memory cells, the respective memory cells being on different decks of the multi-deck memory array;
    reading, from the each respective memory cell, analog information programmed in the plurality of memory cells;
    combining the analog information read from the each respective memory cell, wherein the respective memory cells include a first memory cell and a second memory cell, comprising of different storage material;
    providing an output based on combining the analog information; and
    a first storage element of the first memory cell comprises a first storage material; and a second storage element of the second memory cell comprises a second storage material different from the first storage material.

9. The method of claim 8 wherein accessing the plurality of memory cells comprises biasing respective access lines coupled to respective memory cells on different decks of a multi-deck memory array.

10. The method of claim 9 wherein reading comprises detecting one or more signals generated on one or more respective access lines coupled to the respective memory cells based at least in part on biasing the respective access lines; and
    determining analog values stored by the respective memory cell based at least in part on detecting the one or more signals.

11. The method of claim 10 wherein detecting one or more signals comprises detecting a sub-threshold current associated with at least one respective access line coupled to respective memory cells.

12. The method of claim 8 further comprising determining a synaptic weight value based on the output.

13. A method comprising:
    forming a plurality of respective memory cells in a multi-deck memory array, each memory cell in the respective memory cells having a programming sensitivity different from programming sensitivities of other memory cells in the respective memory cells, the respective memory cells being on different decks of the multi-deck memory array; and
    forming reading circuitry coupled to the respective memory cells, the reading circuitry configured to read the respective memory cells and to provide an output based on a combination of respective analog information read from the respective memory cells;

wherein forming the multi-deck memory array comprises, for each deck:
  forming a bottom access line material;
  forming a top access line material; and
  forming a storage element material between the bottom and the top access line materials, the storage element material comprising chalcogenide;
wherein forming the storage element material for one deck in the multi-deck memory array comprises forming a respective chalcogenide-containing material that has a thickness, or a composition, or both different from a respective chalcogenide-containing material of another deck in the multi-deck memory array.

14. A system comprising:
a memory array comprising a plurality of memory cells, each respective memory cell in the plurality of memory cells having a programming sensitivity different from programming sensitivities of other memory cells in the plurality of memory cells;
an input component configured to receive training stimuli during a training phase;
a programming component configured to apply one or more programming pulses to program respective analog information in the plurality of memory cells based on the received training stimuli; and
a reading component configured to read the respective analog information programmed in the plurality of memory cells, the reading component further configured to provide an output based on a combination of the respective analog information read from the plurality of memory cells;
wherein the output corresponds to a synaptic weight associated to the training stimuli received during the training phase.

15. The system of claim 14 wherein the memory array comprises a multi-deck memory array, the plurality of memory cells being on different decks of the multi-deck memory array.

16. The system of claim 15, wherein a respective memory cell on a deck of the multi-deck memory array comprises a respective storage element material that has a thickness and/or a composition different from another thickness or composition of a respective storage element material of another respective memory cell on a different deck in the multi-deck memory array.

* * * * *